US010438996B2

(12) United States Patent
Kim et al.

(10) Patent No.: US 10,438,996 B2
(45) Date of Patent: Oct. 8, 2019

(54) METHODS OF FABRICATING MAGNETIC TUNNEL JUNCTIONS INTEGRATED WITH SELECTORS

(71) Applicant: Spin Transfer Technologies, Inc., Fremont, CA (US)

(72) Inventors: Kuk-Hwan Kim, Fremont, CA (US); Dafna Beery, Fremont, CA (US); Andy Walker, Fremont, CA (US); Amitay Levi, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/865,247

(22) Filed: Jan. 8, 2018

(65) Prior Publication Data
US 2019/0214430 A1   Jul. 11, 2019

(51) Int. Cl.
*H01L 27/22*     (2006.01)
*H01L 21/768*   (2006.01)
(Continued)

(52) U.S. Cl.
CPC .......... *H01L 27/224* (2013.01); *G11C 11/161* (2013.01); *H01F 10/3254* (2013.01); *H01F 10/3272* (2013.01); *H01F 10/3286* (2013.01); *H01F 41/32* (2013.01); *H01L 21/7684* (2013.01); *H01L 21/76802* (2013.01);
(Continued)

(58) Field of Classification Search
CPC ... H01L 27/224; H01L 43/10; H01L 21/3212; H01L 43/12; H01L 45/1608; H01L 45/146; H01L 45/1233; H01L 45/08; H01L 21/76802; H01L 43/02; H01L 21/7684; H01L 21/76877; G11C 11/161; G11C 2211/5615; H01F 10/329; H01F 41/32; H01F 10/3272; H01F 10/3286; H01F 10/3254
See application file for complete search history.

(56) References Cited

U.S. PATENT DOCUMENTS 4,597,487 A   7/1986   Crosby et al.
5,541,868 A   7/1996   Prinz
(Continued)

FOREIGN PATENT DOCUMENTS

CA   2766141     1/2011
CN   105706259   6/2016
(Continued)

OTHER PUBLICATIONS

US 7,026,672 B2, 04/2006, Grandis (withdrawn)
(Continued)

*Primary Examiner* — Bac H Au

(57) ABSTRACT

Methods of fabricating devices including arrays of integrated Magnetic Tunnel Junctions (MTJs) and corresponding selectors in an array of cells. The array of cells can include a plurality of source lines disposed in columns, set of selectors coupled to respective source lines, MJT structures coupled to respective selectors and a plurality of bit lines disposed in rows and coupled to respective sets of MTJ structures. The array of cells can also include buffers coupled between respective selectors and respective MTJ structures. In addition, multiple arrays can be fabricated on top of each other to implement vertical three-dimensional (3D) MTJ devices.

21 Claims, 28 Drawing Sheets

(51) Int. Cl.
*H01L 43/02* (2006.01)
*G11C 11/16* (2006.01)
*H01F 10/32* (2006.01)
*H01F 41/32* (2006.01)
*H01L 45/00* (2006.01)
*H01L 43/12* (2006.01)
*H01L 43/10* (2006.01)
*H01L 21/321* (2006.01)

(52) U.S. Cl.
CPC ........ *H01L 21/76877* (2013.01); *H01L 43/02* (2013.01); *H01L 43/12* (2013.01); *H01L 45/08* (2013.01); *H01L 45/1233* (2013.01); *H01L 45/146* (2013.01); *H01L 45/1608* (2013.01); *G11C 2211/5615* (2013.01); *H01F 10/329* (2013.01); *H01L 21/3212* (2013.01); *H01L 43/10* (2013.01)

(56) References Cited

U.S. PATENT DOCUMENTS

| | | |
|---|---|---|
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,938,142 B2 | 8/2005 | Pawlowski |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,057,922 B2 | 6/2006 | Fukumoto |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,372,722 B2 | 5/2008 | Jeong |
| 7,376,006 B2 | 5/2008 | Bednorz et al. |
| 7,386,765 B2 | 6/2008 | Ellis |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,642,612 B2 | 1/2010 | Izumi et al. |
| 7,660,161 B2 | 2/2010 | Van Tran |
| 7,733,699 B2 | 6/2010 | Roohparvar |
| 7,773,439 B2 | 8/2010 | Do et al. |
| 7,776,665 B2 | 8/2010 | Izumi et al. |
| 7,852,662 B2 | 12/2010 | Yang et al. |
| 7,881,095 B2 | 2/2011 | Lu et al. |
| 7,911,832 B2 | 3/2011 | Kent et al. |
| 7,936,595 B2 | 5/2011 | Han et al. |
| 7,986,544 B2 | 7/2011 | Kent et al. |
| 8,080,365 B2 | 12/2011 | Nozaki |
| 8,088,556 B2 | 1/2012 | Nozaki |
| 8,094,480 B2 | 1/2012 | Tonomura |
| 8,144,509 B2 | 3/2012 | Jung |
| 8,148,970 B2 | 4/2012 | Fuse |
| 8,255,742 B2 | 8/2012 | Ipek |
| 8,278,996 B2 | 10/2012 | Miki |
| 8,279,666 B2 | 10/2012 | Dieny et al. |
| 8,334,213 B2 | 12/2012 | Mao |
| 8,349,536 B2 | 1/2013 | Nozaki |
| 8,363,465 B2 | 1/2013 | Kent et al. |
| 8,386,836 B2 | 2/2013 | Burger |
| 8,432,727 B2 | 4/2013 | Ryu |

(56) References Cited

U.S. PATENT DOCUMENTS

| | | |
|---|---|---|
| 8,441,844 B2 | 5/2013 | El Baraji |
| 8,456,883 B1 | 6/2013 | Liu |
| 8,456,926 B2 | 6/2013 | Ong |
| 8,492,881 B2 | 7/2013 | Kuroiwa et al. |
| 8,535,952 B2 | 9/2013 | Ranjan et al. |
| 8,539,303 B2 | 9/2013 | Lu |
| 8,549,303 B2 | 10/2013 | Fifield et al. |
| 8,574,928 B2 | 11/2013 | Satoh et al. |
| 8,582,353 B2 | 11/2013 | Lee |
| 8,593,868 B2 | 11/2013 | Park |
| 8,617,408 B2 | 12/2013 | Balamane |
| 8,625,339 B2 | 1/2014 | Ong |
| 8,634,232 B2 | 1/2014 | Oh |
| 8,716,817 B2 | 5/2014 | Saida |
| 8,737,137 B1 | 5/2014 | Choy et al. |
| 8,780,617 B2 | 7/2014 | Kang |
| 8,792,269 B1 | 7/2014 | Abedifard |
| 8,852,760 B2 | 10/2014 | Wang et al. |
| 8,902,628 B2 | 12/2014 | Ha |
| 8,966,345 B2 | 2/2015 | Wilkerson |
| 9,019,754 B1 | 4/2015 | Bedeschi |
| 9,026,888 B2 | 5/2015 | Kwok |
| 9,043,674 B2 | 5/2015 | Wu |
| 9,082,888 B2 | 7/2015 | Kent et al. |
| 9,104,595 B2 | 8/2015 | Sah |
| 9,140,747 B2 | 9/2015 | Kim |
| 9,165,629 B2 | 10/2015 | Chih |
| 9,166,155 B2 | 10/2015 | Deshpande |
| 9,229,853 B2 | 1/2016 | Khan |
| 9,245,608 B2 | 1/2016 | Chen et al. |
| 9,250,990 B2 | 2/2016 | Motwani |
| 9,263,667 B1 | 2/2016 | Pinarbasi |
| 9,298,552 B2 | 3/2016 | Leem |
| 9,299,412 B2 | 3/2016 | Naeimi |
| 9,317,429 B2 | 4/2016 | Ramanujan |
| 9,337,412 B2 | 5/2016 | Pinarbasi et al. |
| 9,362,486 B2 | 6/2016 | Kim et al. |
| 9,378,817 B2 | 6/2016 | Kawai |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,449,720 B1 | 9/2016 | Lung |
| 9,450,180 B1 | 9/2016 | Annunziata |
| 9,455,013 B2 | 9/2016 | Kim |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,508,456 B1 | 11/2016 | Shim |
| 9,548,445 B2 | 1/2017 | Lee et al. |
| 9,553,102 B2 | 1/2017 | Wang |
| 9,583,167 B2 | 2/2017 | Chung |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,865,806 B2 | 1/2018 | Choi et al. |
| 9,972,775 B2 * | 5/2018 | Shum ............... H01L 43/12 |
| 10,026,609 B2 | 7/2018 | Sreenivasan et al. |
| 10,043,851 B1 | 8/2018 | Shen |
| 10,115,446 B1 | 10/2018 | Louie et al. |
| 10,163,479 B2 | 12/2018 | Yoha |
| 2002/0057593 A1 | 5/2002 | Hidaka |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0047179 A1 | 3/2004 | Chan |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0197174 A1 | 10/2004 | Van Den Berg |
| 2004/0221030 A1 | 11/2004 | Huras |
| 2004/0257717 A1 | 12/2004 | Sharma et al. |
| 2005/0022746 A1 | 2/2005 | Lampe |
| 2005/0029551 A1 | 2/2005 | Atwood et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0160205 A1 | 7/2005 | Kuo |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0251628 A1 | 11/2005 | Jarvis et al. |
| 2005/0280058 A1 | 12/2005 | Pakala et al. |
| 2005/0285176 A1 | 12/2005 | Kim |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0198202 A1 | 9/2006 | Erez |
| 2006/0227465 A1 | 10/2006 | Inokuchi et al. |
| 2006/0271755 A1 | 11/2006 | Miura |
| 2006/0284183 A1 | 12/2006 | Izumi et al. |
| 2006/0291305 A1 | 12/2006 | Suzuki et al. |
| 2007/0019337 A1 | 1/2007 | Apalkov et al. |
| 2007/0094573 A1 | 4/2007 | Chen |
| 2007/0096229 A1 | 5/2007 | Yoshikawa |
| 2007/0220935 A1 | 9/2007 | Cernea |
| 2007/0226592 A1 | 9/2007 | Radke |
| 2007/0242501 A1 | 10/2007 | Hung et al. |
| 2007/0283313 A1 | 12/2007 | Ogawa |
| 2007/0285972 A1 | 12/2007 | Horii |
| 2008/0049487 A1 | 2/2008 | Yoshimura |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0144376 A1 | 6/2008 | Lee |
| 2008/0151614 A1 | 6/2008 | Guo |
| 2008/0181009 A1 | 7/2008 | Arai |
| 2008/0259508 A2 | 10/2008 | Kent et al. |
| 2008/0294938 A1 | 11/2008 | Kondo |
| 2008/0297292 A1 | 12/2008 | Viala et al. |
| 2009/0040825 A1 | 2/2009 | Adusumilli et al. |
| 2009/0046501 A1 | 2/2009 | Ranjan et al. |
| 2009/0072185 A1 | 3/2009 | Raksha et al. |
| 2009/0078927 A1 | 3/2009 | Xiao |
| 2009/0080267 A1 | 3/2009 | Bedeschi |
| 2009/0091037 A1 | 4/2009 | Assefa et al. |
| 2009/0098413 A1 | 4/2009 | Kanegae |
| 2009/0130779 A1 | 5/2009 | Li |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0039136 A1 | 2/2010 | Chua-Eoan |
| 2010/0080040 A1 | 4/2010 | Choi |
| 2010/0087048 A1 | 4/2010 | Izumi et al. |
| 2010/0110803 A1 | 5/2010 | Arai |
| 2010/0124091 A1 | 5/2010 | Cowburn |
| 2010/0162065 A1 | 6/2010 | Norman |
| 2010/0193891 A1 | 8/2010 | Wang et al. |
| 2010/0195362 A1 | 8/2010 | Norman |
| 2010/0195401 A1 | 8/2010 | Jeong et al. |
| 2010/0227275 A1 | 9/2010 | Nozaki |

(56) References Cited

U.S. PATENT DOCUMENTS

| | | |
|---|---|---|
| 2010/0232206 A1 | 9/2010 | Li |
| 2010/0246254 A1 | 9/2010 | Prejbeanu et al. |
| 2010/0248154 A1 | 9/2010 | Nozaki |
| 2010/0254181 A1 | 10/2010 | Chung |
| 2010/0271090 A1 | 10/2010 | Rasmussen |
| 2010/0271870 A1 | 10/2010 | Zheng et al. |
| 2010/0277976 A1 | 11/2010 | Oh |
| 2010/0290275 A1 | 11/2010 | Park et al. |
| 2010/0311243 A1 | 12/2010 | Mao |
| 2011/0001108 A1 | 1/2011 | Greene |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0076620 A1 | 3/2011 | Nozaki |
| 2011/0089511 A1 | 4/2011 | Keshtbod et al. |
| 2011/0133298 A1 | 6/2011 | Chen et al. |
| 2011/0283135 A1 | 11/2011 | Burger |
| 2011/0310691 A1 | 12/2011 | Zhou et al. |
| 2011/0320696 A1 | 12/2011 | Fee et al. |
| 2012/0028373 A1 | 2/2012 | Belen |
| 2012/0052258 A1 | 3/2012 | Op DeBeeck et al. |
| 2012/0069649 A1 | 3/2012 | Ranjan et al. |
| 2012/0127804 A1 | 5/2012 | Ong et al. |
| 2012/0155158 A1 | 6/2012 | Higo |
| 2012/0163113 A1 | 6/2012 | Hatano et al. |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0221905 A1 | 8/2012 | Burger |
| 2012/0228728 A1 | 9/2012 | Ueki et al. |
| 2012/0239969 A1 | 9/2012 | Dickens |
| 2012/0254636 A1 | 10/2012 | Tsukamoto et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2012/0324274 A1 | 12/2012 | Hon |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0039119 A1 | 2/2013 | Rao |
| 2013/0044537 A1 | 2/2013 | Ishigaki |
| 2013/0075845 A1 | 3/2013 | Chen et al. |
| 2013/0107633 A1 | 5/2013 | Kim |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0275691 A1 | 10/2013 | Chew |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara |
| 2014/0042571 A1 | 2/2014 | Gan et al. |
| 2014/0048896 A1 | 2/2014 | Huang et al. |
| 2014/0063949 A1 | 3/2014 | Tokiwa |
| 2014/0070341 A1 | 3/2014 | Beach et al. |
| 2014/0089762 A1 | 3/2014 | Pangal et al. |
| 2014/0103469 A1 | 4/2014 | Jan |
| 2014/0103472 A1 | 4/2014 | Kent et al. |
| 2014/0136870 A1 | 5/2014 | Breternitz et al. |
| 2014/0149827 A1 | 5/2014 | Kim et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0219034 A1 | 8/2014 | Gomez et al. |
| 2014/0252439 A1 | 9/2014 | Guo |
| 2014/0264671 A1 | 9/2014 | Chepulskyy et al. |
| 2014/0269005 A1 | 9/2014 | Kang |
| 2014/0281284 A1 | 9/2014 | Block et al. |
| 2014/0289358 A1 | 9/2014 | Lindamood |
| 2014/0321196 A1 | 10/2014 | Ikeda |
| 2015/0021675 A1 | 1/2015 | Min |
| 2015/0056368 A1 | 2/2015 | Wang et al. |
| 2015/0098287 A1 | 4/2015 | Lee |
| 2015/0100848 A1 | 4/2015 | Kalamatianos |
| 2015/0135039 A1 | 5/2015 | Mekhanik et al. |
| 2015/0143343 A1 | 5/2015 | Weiss |
| 2015/0154116 A1 | 6/2015 | Dittrich |
| 2015/0171316 A1 | 6/2015 | Park et al. |
| 2015/0206568 A1 | 7/2015 | Bose et al. |
| 2015/0206569 A1 | 7/2015 | Bose et al. |
| 2015/0242269 A1 | 8/2015 | Pelley et al. |
| 2015/0262701 A1 | 9/2015 | Takizawa |
| 2015/0278011 A1 | 10/2015 | Keppel et al. |
| 2015/0279904 A1 | 10/2015 | Pinarbasi et al. |
| 2015/0378814 A1 | 12/2015 | Webb et al. |
| 2015/0380088 A1 | 12/2015 | Naeimi et al. |
| 2016/0020250 A1 | 1/2016 | Li et al. |
| 2016/0027525 A1 | 1/2016 | Kim et al. |
| 2016/0027999 A1 | 1/2016 | Pinarbasi |
| 2016/0043304 A1 | 2/2016 | Chen |
| 2016/0056072 A1 | 2/2016 | Arvin et al. |
| 2016/0085443 A1 | 3/2016 | Tomishima et al. |
| 2016/0085621 A1 | 3/2016 | Motwani |
| 2016/0086600 A1 | 3/2016 | Bauer et al. |
| 2016/0087193 A1 | 3/2016 | Pinarbasi et al. |
| 2016/0093798 A1 | 3/2016 | Kim et al. |
| 2016/0111634 A1 | 4/2016 | Lee et al. |
| 2016/0118249 A1 | 4/2016 | Sreenivasan et al. |
| 2016/0124299 A1 | 5/2016 | Yu et al. |
| 2016/0126201 A1 | 5/2016 | Arvin et al. |
| 2016/0126452 A1 | 5/2016 | Kuo et al. |
| 2016/0126453 A1 | 5/2016 | Chen et al. |
| 2016/0148685 A1 | 5/2016 | Roy |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0260486 A1 | 9/2016 | Tani |
| 2016/0268499 A1 | 9/2016 | You et al. |
| 2016/0283385 A1 | 9/2016 | Boyd et al. |
| 2016/0284762 A1 | 9/2016 | Wang et al. |
| 2016/0300615 A1 | 10/2016 | Lee |
| 2016/0307860 A1 | 10/2016 | Arvin et al. |
| 2016/0315118 A1 | 10/2016 | Kardasz et al. |
| 2016/0315249 A1 | 10/2016 | Kardasz et al. |
| 2016/0315259 A1 | 10/2016 | Fennimore et al. |
| 2016/0085692 A1 | 12/2016 | Kwok |
| 2016/0358778 A1 | 12/2016 | Park et al. |
| 2016/0372656 A1 | 12/2016 | Pinarbasi et al. |
| 2016/0378592 A1 | 12/2016 | Ikegami et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0047107 A1 | 2/2017 | Berger et al. |
| 2017/0062712 A1 | 3/2017 | Choi et al. |
| 2017/0069837 A1 | 3/2017 | Choi et al. |
| 2017/0084826 A1 | 3/2017 | Zhou et al. |
| 2017/0123991 A1 | 5/2017 | Sela et al. |
| 2017/0133104 A1 | 5/2017 | Darbari et al. |
| 2017/0169872 A1 | 6/2017 | Yoda et al. |
| 2017/0170237 A1 | 6/2017 | Jung |
| 2017/0199459 A1 | 7/2017 | Ryu et al. |
| 2017/0222132 A1 | 8/2017 | Pinarbasi et al. |
| 2017/0270988 A1 | 9/2017 | Ikegami |
| 2018/0018134 A1 | 1/2018 | Kang |
| 2018/0019343 A1 | 1/2018 | Asami |
| 2018/0033957 A1 | 2/2018 | Zhang |
| 2018/0097175 A1 | 4/2018 | Chuang |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |

(56) References Cited

U.S. PATENT DOCUMENTS

| | | | |
|---|---|---|---|
| 2018/0248110 A1 | 8/2018 | Kardasz et al. | |
| 2018/0248113 A1 | 8/2018 | Pinarbasi et al. | |
| 2018/0331279 A1 | 11/2018 | Shen | |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |
| WO | 2011-005484 | 1/2011 |
| WO | 2014-062681 | 4/2014 |
| WO | 2017052622 | 3/2017 |

OTHER PUBLICATIONS

US 2016/0218273 A1, 06/2016, Pinarbasi (withdrawn)

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

\* cited by examiner

METHODS OF FABRICATING MAGNETIC TUNNEL JUNCTIONS INTEGRATED WITH SELECTORS

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, game consoles, servers, distributed computing systems, and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers of a Magnetic Tunnel Junction (MTJ). Referring to FIGS. 1A and 1B, a simplified diagram of a MTJ, in accordance with the convention art, is shown. The MTJ can include two magnetic layers 110, 120, and a magnetic tunnel barrier layer 130. One of the magnetic layers 110 can have a fixed magnetization polarization 140, while the polarization of the magnetization of the other magnetic layer 120 can switch between opposite directions 150, 160. Typically, if the magnetic layers have the same magnetization polarization 140, 150, the MTJ cell will exhibit a relatively low resistance value corresponding to a '1' bit state; while if the magnetization polarization between the two magnetic layers is antiparallel 140, 160 the MTJ cell will exhibit a relatively high resistance value corresponding to a '0' bit state. Because the data is stored in the magnetic fields, MRAM devices are non-volatile memory devices. The state of a MRAM cell can be read by applying a predetermined current through the cell and measuring the resulting voltage, or by applying a predetermined voltage across the cell and measuring the resulting current. The sensed current or voltage is proportional to the resistance of the cell and can be compared to a reference value to determine the state of the cell.

MRAM devices are characterized by densities similar to Dynamic Random-Access Memory (DRAM), power consumption similar to flash memory, and speed similar to Static Random-Access Memory (SRAM). Although MRAM devices exhibit favorable performance characteristics as compared to other memory technologies, there is a continuing need for improved MRAM devices and methods of manufacture thereof.

SUMMARY OF THE INVENTION

The present technology may best be understood by referring to the following description and accompanying drawings that are used to illustrate embodiments of the present technology directed toward methods of fabricating devices including arrays of integrated Magnetic Tunnel Junctions (MTJs) and corresponding selectors.

In one aspect, a method of manufacturing a MTJ device can include forming a plurality of source line trenches disposed in columns in a first dielectric layer. A plurality of source line conductors can be formed in the plurality of source line trenches, wherein a surface of the source line conductors are coplanar with a surface of the first dielectric layer. A second dielectric layer can be formed on the first dielectric layer and the source line conductors, and an array of selector openings can be fabricated in the second dielectric layer, wherein sets of selector openings extended to respective source line conductors. An array of selectors can be formed in the array of selector openings, wherein a surface of the selectors are coplanar with a surface of the second dielectric layer. An array of MTJ pillars coupled to the array of selectors can thereafter be formed.

In another aspect, a method of manufacturing a MTJ device can include forming a plurality of source line trenches disposed in columns in a first dielectric layer. A plurality of source line conductors can be formed in the plurality of source line trenches. A selector layer can be formed over the first dielectric layer and the plurality of source line conductors. A reference magnetic layer, a non-magnetic tunneling barrier layer, and a free magnetic layer can be formed over the selector layer. A first portion of an array of pillars can be formed from the free magnetic layer, the non-magnetic tunneling barrier layer and reference magnetic layer. A conformal dielectric layer can be formed on the exposed portions of the free magnetic layer, the non-magnetic tunnel barrier layer, and the reference magnetic layer in the first portion of the pillars and the exposed portions of the first barrier layer. A second portion of the array of pillars can be formed from the first barrier layer and the select layer, wherein portions of the conformal dielectric layer along sidewalls of the first portion of the array of pillars protect one or more of the free magnetic layer, the non-magnetic tunneling barrier layer and the reference magnetic layer during forming the second portion of the array of pillars.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1A:
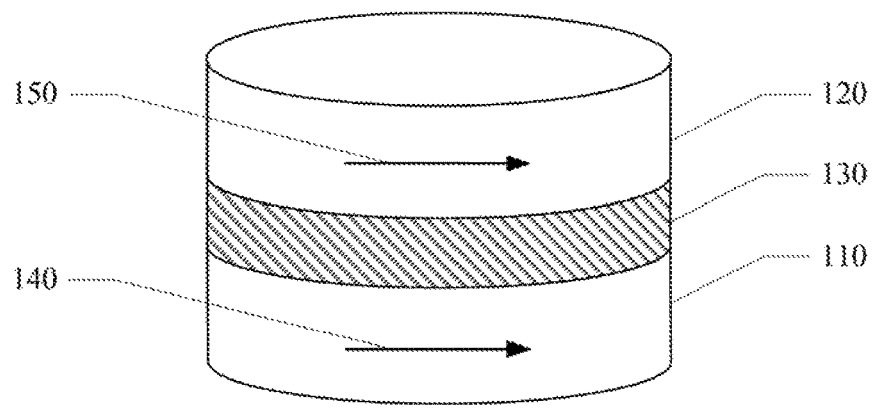
FIGS. 1A and 1B show a simplified diagram of a MTJ, in accordance with the convention art.
Figure 1B:
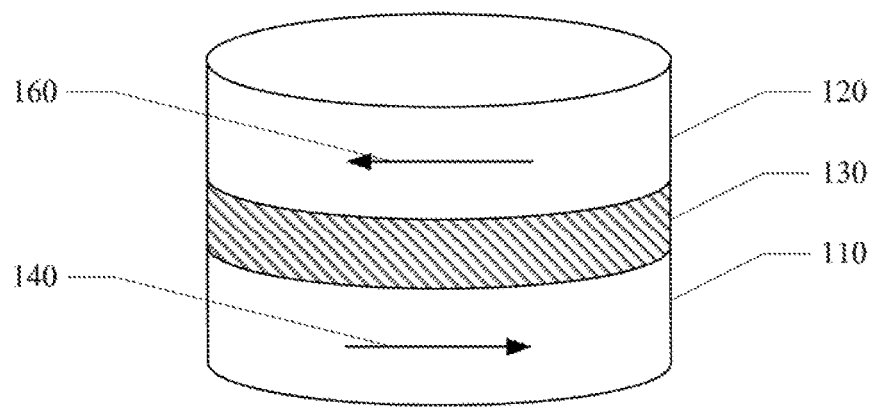

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
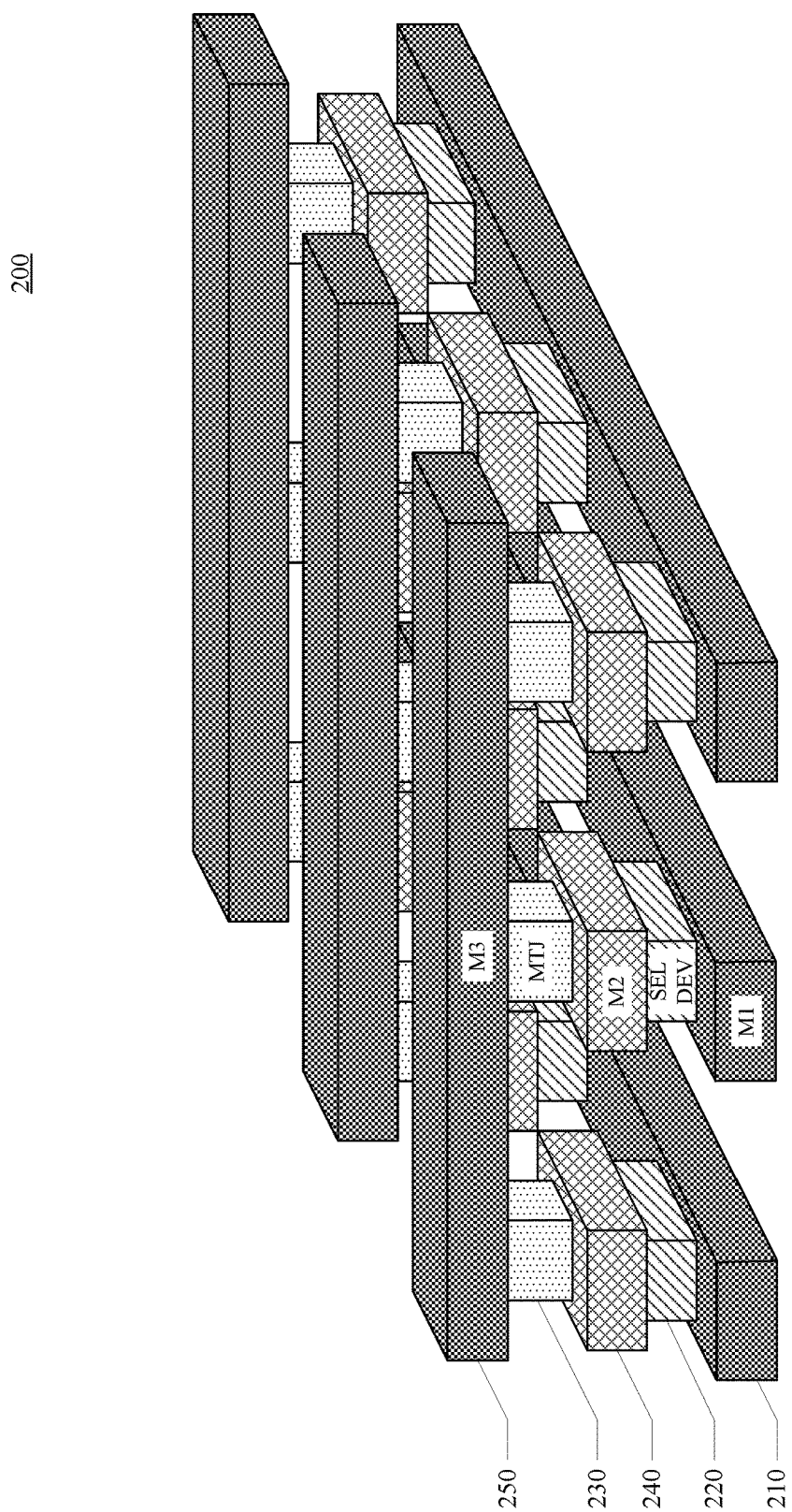
FIG. 2 shows a block diagram of a cell array of a Magnetic Tunnel Junction (MTJ) device, in accordance with aspects of the present technology.

Referring to FIG. 2, a block diagram of a cell array of a Magnetic Tunnel Junction (MTJ) device, in accordance with aspects of the present technology, is shown. The MTJ device can be a Magnetoresistive Random Access Memory (MRAM), Spin Torque Magnetoresistive Random Access Memory (ST-MRAM) or similar memory device. In some aspects, the cell array 200 can include a plurality of source lines 210 disposed in columns on a wafer. In one implementation, the plurality of source lines 210 can include Copper (Cu), Tungsten (W) or other similar conductive material. For conductive material like Copper (Cu) which is characterized by a relatively high solubility and diffusivity in oxide, the plurality of source lines 210 can also include a Titanium Nitride (TiN), a Tantalum Nitride (TaN), Titanium Nitride/Tantalum Nitride (TiN/TaN) or similar capping layer. In one implementation, one or more dielectric materials can be disposed between the columns of source lines 210. In one example, the plurality of source lines 210 can be a first metalization (M1) layer.

In some aspects, the cell array 200 can include an array of selectors 220. Sets of selectors 220 can be coupled to respective source lines 210. The selectors 220 can be two-terminal elements in which the conductivity of a given selector can be controlled by the potential voltage applied across the given selector. For example, the selector 220 can be in a low resistance state when a first voltage is applied across the given selector, and the selector can be in a high resistance state when a second voltage is applied across the given selector. However, unlike the MTJ, the selector 220 does not retain a state. In one implementation, the array of selectors 220 can include a Nickel Oxide (NiOx), Titanium Oxide (TiOx), or Vanadium Oxide (VOx) or other similar material. In one implementation, one or more dielectric materials can be disposed between the array of selectors 220.

In some aspects, the cell array 200 can include an array of MTJ structures 230. The MTJ structures 230 can be coupled to respective selectors 220. The MTJ can include two magnetic layers and a magnetic tunnel barrier layer therebetween. One of the magnetic layers can have a fixed magnetization polarization, while the polarization of the magnetization of the other magnetic layer can switch between opposite directions. Typically, if the magnetic layers have the same magnetization polarization, the MTJ cell will exhibit a relatively low resistance value corresponding to a '1' bit state; while if the magnetization polarization between the two magnetic layers is antiparallel the MTJ cell will exhibit a relatively high resistance value corresponding to a '0' bit state. In one implementation, the MTJ structures 230 can include one or more first ferromagnetic layers, one or more non-magnetic layers disposed on the one or more first ferromagnetic layers, and one or more second ferromagnetic layers of a Synthetic Antiferromagnetic (SAF) portion of the MTJ. The MTJ structures 230 can also include one or more reference magnetic layers, one or more non-magnetic tunneling barrier layers disposed on the one or more reference magnetic layers, and one or more free magnetic layers disposed on the one or more non-magnetic tunneling barrier layers of a MTJ. Some or all of the one or more reference magnetic layers of the MTJ and some or all of the one or more second ferromagnetic layers of the SAF may be shared between both the MTJ and SAF portions of the MTJ structure. The MTJ structure 230 can also include one or more capping layers disposed on the free magnetic layer. In one implementation, a first ferromagnetic layer can include one or more of Cobalt (Co), Platinum (Pt), and Ruthenium (Ru), a first non-magnetic layer can include Magnesium Oxide (MgOx), a reference magnetic layer can include one or more of Cobalt (Co), Iron (Fe), and Boron (B), a non-magnetic tunneling barrier layer can include Magnesium Oxide (MgOx), and a free magnetic layer can include one or more of Cobalt (Co), Iron (Fe), Boron (B), and Tungsten (W). Each MTJ structure 230 may be implemented in a pillar, with one or more dielectric materials disposed between the array of MTJ pillars. The MTJ structures 230 can also include one or more additional layers, such as one or more seed layers, one or more anti-ferromagnetic (AFM) coupling layers, one or more ferromagnetic (FM) coupling layers, one or more Processional Spin Current (PSC) coupling layers, one or more Perpendicular Magnetic Anisotropy (PMA) layers, and the like.

In some aspects, the cell array 200 can optionally include an array of buffers 240 disposed between respective selectors 220 and respective MTJ structures 230. The array of buffers can provide a crystallization structure upon which MTJ structures 230 can be fabricate. The array of buffers can also provide a separation for the MTJ structures 230 so that the array of selectors 220 have a reduced effect on the device characteristics of the MTJ structures 230. In one implementation, the array of buffers 240 can include Tantalum Nitride (TaN) or Titanium Nitride (TiN) or similar material. In one implementation, one or more dielectric materials can be disposed between the array of buffers 240. In one example, the array of buffers 240 can be a second metalization (M2) layer. If the array of buffers 240 are not included, the plurality of source lines 230 can include Tantalum Nitride (TaN) or Titanium Nitride (TiN) or similar material.

In some aspects, the cell array 200 can include a plurality of bit lines 250 disposed in rows. The plurality of bit lines 250 can be coupled to respective sets of MTJ structures 230. In one implementation, the plurality of bit lines 250 can include Tantalum Nitride (TaN) or Titanium Nitride (TiN) or similar material. In one implementation, one or more dielectric materials can be disposed between the rows of bit lines 250. In one example, the plurality of bit lines 250 can be a third metalization (M3) layer.

The cell array 200 of the MTJ device can include numerous other layers, structures, and the like that are not germane to an understanding of aspects of the present technology. Therefore, the other layers, structures and the like of the MTJ device are not described herein.

Figure 3:
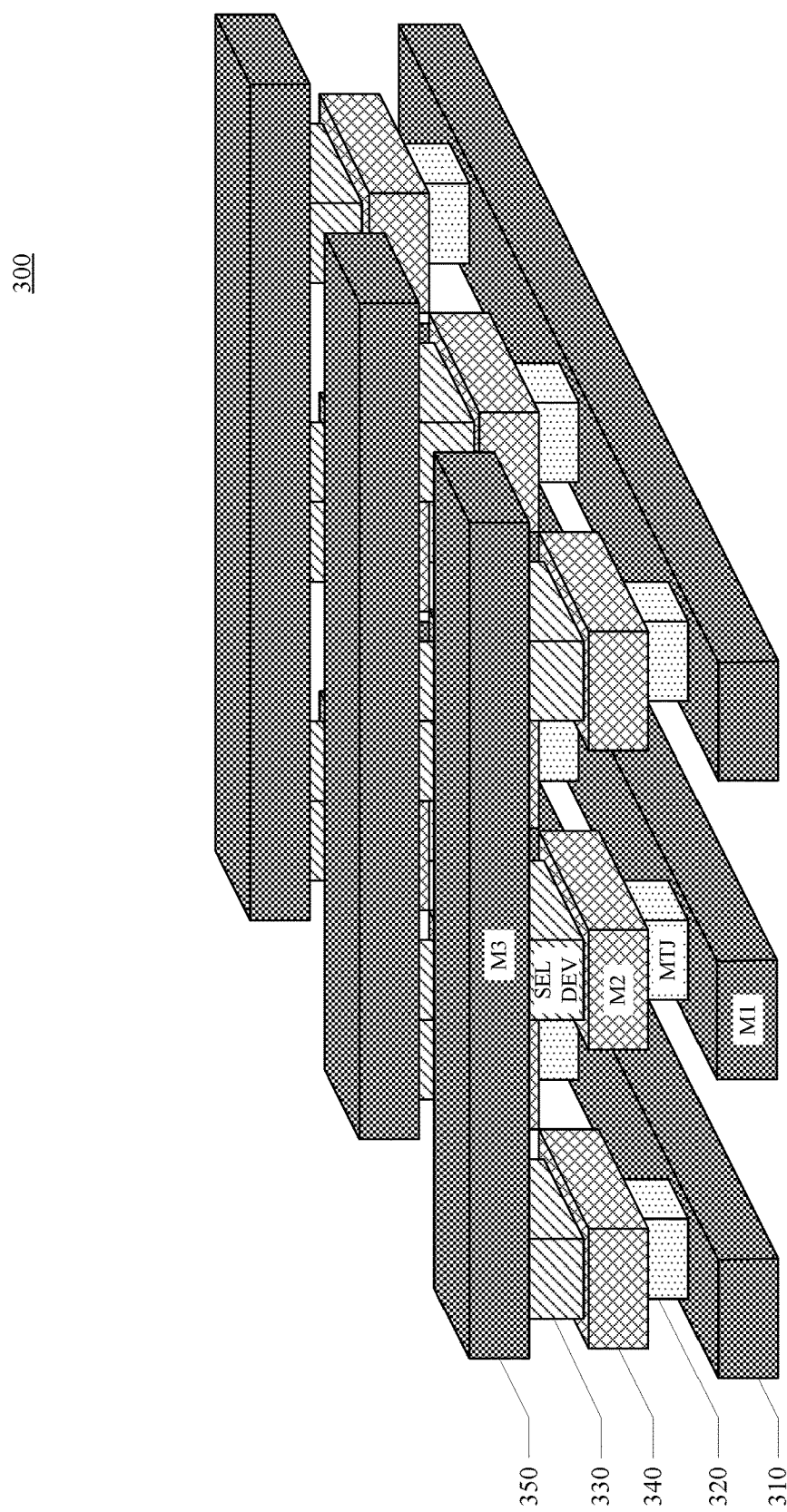
FIG. 3 shows a block diagram of a cell array of a Magnetic Tunnel Junction (MTJ) device, in accordance with aspects of the present technology.

Referring now to FIG. 3 a block diagram of a cell array of a Magnetic Tunnel Junction (MTJ) device, in accordance with aspects of the present technology, is shown. The MTJ device can be a MRAM, ST-MRAM or similar memory device. In some aspects, the cell array 300 can include a plurality of bit lines 310 disposed in rows on a wafer. In one implementation, the plurality of bit lines 310 can include Copper (Cu), Tungsten (W) or other similar conductive material. For conductive material like Copper (Cu) which is characterized by a relatively high solubility and diffusivity in oxide, the plurality of bit lines 310 can also include a Titanium Nitride (TiN), a Tantalum Nitride (TaN), Titanium Nitride/Tantalum Nitride (TiN/TaN) or similar capping layer. In one implementation, one or more dielectric materials can be disposed between the rows of bit lines 310. In one example, the plurality of bit lines 310 can be a first metalization (M1) layer.

In some aspects, the cell array 300 can include an array of MTJ structures 320. Sets of the MTJ structures 320 can be coupled to respective bit lines 310. The MTJ can include two magnetic layers and a magnetic tunnel barrier layer therebetween. One of the magnetic layers can have a fixed magnetization polarization, while the polarization of the magnetization of the other magnetic layer can switch between opposite directions. Typically, if the magnetic layers have the same magnetization polarization, the MTJ cell will exhibit a relatively low resistance value corresponding to a '1' bit state; while if the magnetization polarization between the two magnetic layers is antiparallel the MTJ cell will exhibit a relatively high resistance value corresponding to a '0' bit state. In one implementation, the MTJ structures 320 can include one or more first ferromagnetic layers, one or more non-magnetic layers disposed on the one or more first ferromagnetic layers, and one or more second ferromagnetic layers of a Synthetic Antiferromagnetic (SAF) portion of the MTJ. The MTJ structures 320 can also include one or more reference magnetic layers, one or more non-magnetic tunneling barrier layers disposed on the one or more reference magnetic layers, and one or more free magnetic layers disposed on the one or more non-magnetic tunneling barrier layers of a MTJ. Some or all of the one or more reference magnetic layers of the MTJ and some or all of the one or more second ferromagnetic layers of the SAF may be shared between both the MTJ and SAF portions of the MTJ structure. The MTJ structure 320 can also include one or more capping layers disposed on the free magnetic layer. In one implementation, a first ferromagnetic layer can include one or more of Cobalt (Co), Platinum (Pt), and Ruthenium (Ru), a first non-magnetic layer can include Magnesium Oxide (MgOx), a reference magnetic layer can include one or more of Cobalt (Co), Iron (Fe), and Boron (B), a non-magnetic tunneling barrier layer can include Magnesium Oxide (MgOx), and a free magnetic layer can include one or more of Cobalt (Co), Iron (Fe), Boron (B), and Tungsten (W). Each MTJ structure 320 may be implemented in a pillar, with one or more dielectric materials disposed between the array of MTJ pillars. The MTJ structures 320 can also include one or more additional layers, such as one or more see layers, one or more anti-ferromagnetic (AFM) coupling layers, one or more ferromagnetic (FM) coupling layers, one or more Processional Spin Current (PSC) coupling layers, one or more Perpendicular Magnetic Anisotropy (PMA) layers, and the like.

In some aspects, the cell array 300 can include an array of selectors 330. The selectors 330 can be coupled to respective MTJ structures 320. The selectors 330 can be two-terminal elements in which the conductivity of a given selector can be controlled by the potential voltage applied across the given selector. For example, the selector 330 can be in a low resistance state when a first voltage is applied across the given selector, and the selector 330 can be in a high resistance state when a second voltage is applied across the given selector. In one implementation, the array of selectors 330 can include a Nickel Oxide (NiOx), Titanium Oxide (TiOx), or Vanadium Oxide (VOx) or other similar material. In one implementation, one or more dielectric materials can be disposed between the array of selectors 330.

In some aspects, the cell array 300 can optionally include an array of buffers 340 disposed between respective MTJ structures 320 and respective selectors 330. The array of buffers can provide a separation for the MTJ structures 320 so that the array of selectors 330 have a reduced effect on the device characteristics of the MTJ structures 320. In one implementation, the array of buffers 340 can include Tantalum Nitride (TaN) or Titanium Nitride (TiN) or similar material. In one implementation, one or more dielectric materials can be disposed between the array of buffers 340. In one example, the array of buffers 340 can be a second metalization (M2) layer.

In some aspects, the cell array 300 can include a plurality of source lines 350 disposed in columns. The plurality of source lines 350 can be coupled to respective sets of selectors 330. In one implementation, the plurality of source lines 350 can include Tantalum Nitride (TaN) or Titanium Nitride (TiN) or similar material. In one implementation, one or more dielectric materials can be disposed between the columns of source lines 350. In one example, the plurality of source lines 350 can be a third metalization (M3) layer.

The cell array 300 of the MTJ device can include numerous other layers, structures, and the like that are not germane to an understanding of aspects of the present technology. Therefore, the other layers, structures and the like of the MTJ device are not described herein.

As described above, the MTJ structures 230 can be disposed on top of the selectors 220, relative to the wafer, as illustrated in FIG. 2. Alternatively, the selectors 330 can be disposed on top of the MTJ structures 320, relative to the wafer, as illustrated in FIG. 3. The relative position of the MTJ structures 230, 320 and the selectors 220, 330 can be advantageous in the fabrication of the MTJ device as will be further explained with reference to the methods of manufacturing described herein.

Figure 4:
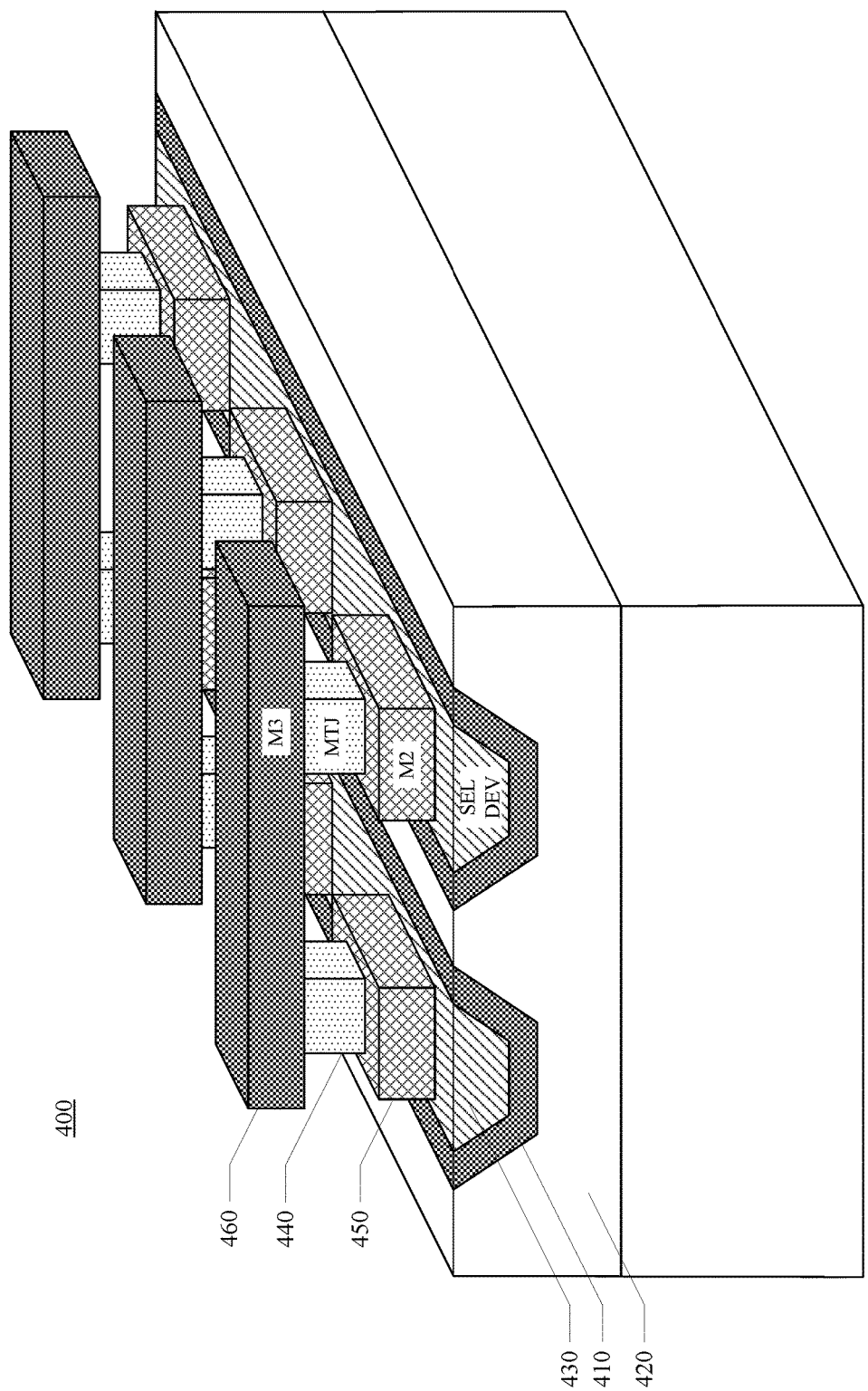
FIG. 4 shows a block diagram of a cell array of a Magnetic Tunnel Junction (MTJ) device, in accordance with aspects of the present technology.

Referring now to FIG. 4, a block diagram of a cell array of a Magnetic Tunnel Junction (MTJ) device, in accordance with aspects of the present technology, is shown. The MTJ device can be a MRAM, ST-MRAM or similar memory device. In some aspects, the cell array 400 can include a plurality of source line layers 410 disposed in columns. The source line layers 410 can be disposed in corresponding trenches in a dielectric layer 420 of a wafer. In one implementation, the plurality of source line layers 410 can include Copper (Cu), Tungsten (W) or other similar conductive material. For conductive material like Copper (Cu) which is characterized by a relatively high solubility and diffusivity in oxide, the plurality of source line layers 410 can also include a Titanium Nitride (TiN), a Tantalum Nitride (TaN), Titanium Nitride/Tantalum Nitride (TiN/TaN) or similar capping layer. In one example, the plurality of source line layers 410 can be a first metalization (M1) layer.

In some aspects, the cell array 400 can include an array of selectors 430. The array of selectors 430 can be disposed on respective source line layers 410 in the corresponding trenches in the dielectric layer 420. The selectors 430 can be two-terminal elements in which the conductivity of a given selector can be controlled by the potential voltage applied across the given selector. For example, the selector 430 can be in a low resistance state when a first voltage is applied across the given selector, and the selector 430 can be in a high resistance state when a second voltage is applied across the given selector. In one implementation, the array of selectors 430 can include a Nickel Oxide (NiOx), Titanium Oxide (TiOx), or Vanadium Oxide (VOx) or other similar material. In some aspects, a surface of the source line layers 410, and a surface of the selectors 430 can be coplanar with a surface of the dielectric layer 420.

In some aspects, the cell array 400 can include an array of MTJ structures 440. The MTJ structures 440 can be coupled to respective selectors 430. The MTJ structure 440 can include two magnetic layers and a magnetic tunnel barrier layer therebetween. One of the magnetic layers can have a fixed magnetization polarization, while the polarization of the magnetization of the other magnetic layer can switch between opposite directions. Typically, if the magnetic layers have the same magnetization polarization, the MTJ cell will exhibit a relatively low resistance value corresponding to a '1' bit state; while if the magnetization polarization between the two magnetic layers is antiparallel the MTJ cell will exhibit a relatively high resistance value corresponding to a '0' bit state. In one implementation, the MTJ structures 440 can include one or more first ferromagnetic layers, one or more non-magnetic layers disposed on the one or more first ferromagnetic layers, and one or more second ferromagnetic layers of a Synthetic Antiferromagnetic (SAF) portion of the MTJ. The MTJ structures 230 can also include one or more reference magnetic layers, one or more non-magnetic tunneling barrier layers disposed on the one or more reference magnetic layers, and one or more free magnetic layers disposed on the one or more non-magnetic tunneling barrier layers of a MTJ. Some or all of the one or more reference magnetic layers of the MTJ and some or all of the one or more second ferromagnetic layers of the SAF may be shared between both the MTJ and SAF portions of the MTJ structure. The MTJ structure 440 can also include one or more capping layers disposed on the free magnetic layer. In one implementation, a first ferromagnetic layer can include one or more of Cobalt (Co), Platinum (Pt), and Ruthenium (Ru), a first non-magnetic layer can include Magnesium Oxide (MgOx), a reference magnetic layer can include one or more of Cobalt (Co), Iron (Fe), and Boron (B), a non-magnetic tunneling barrier layer can include Magnesium Oxide (MgOx), and a free magnetic layer can include one or more of Cobalt (Co), Iron (Fe), Boron (B), and Tungsten (W). Each MTJ structure 40 may be implemented in a pillar, with one or more dielectric materials (not shown) disposed between the array of MTJ pillars. The MTJ structures 440 can also include one or more additional layers, such as one or more seed layers, one or more anti-ferromagnetic (AFM) coupling layers, one or more ferromagnetic (FM) coupling layers, one or more Processional Spin Current (PSC) coupling layers, one or more Perpendicular Magnetic Anisotropy (PMA) layers, and the like.

In some aspects, the cell array 400 can optionally include an array of buffers 450 disposed between respective selectors 430 and respective MTJ structures 440. The array of buffers 450 can provide a crystallization structure upon which MTJ structures 440 can be fabricate. The array of buffers 450 can also provide a separation for the MTJ structures 440 so that the array of selectors 430 have a reduced effect on the device characteristics of the MTJ structures 230. In one implementation, the array of buffers 450 can include Tantalum Nitride (TaN) or Titanium Nitride (TiN) or similar material. In one implementation, one or more dielectric materials (not shown) can be disposed between the array of buffers 450. In one example, the array of buffers 450 can be a second metalization (M2) layer.

In some aspects, the cell array 400 can include a plurality of bit lines 460 disposed in rows. The plurality of bit lines 460 can be coupled to respective sets of MTJ structures 440. In one implementation, the plurality of bit lines 460 can include Tantalum Nitride (TaN) or Titanium Nitride (TiN) or similar material. In one implementation, one or more dielectric materials (not shown) can be disposed between the rows of bit lines 460. In one example, the plurality of bit lines 460 can be a third metalization (M3) layer.

The cell array 400 of the MTJ device can include numerous other layers, structures, and the like that are not germane to an understanding of aspects of the present technology. Therefore, the other layers, structures and the like of the MTJ device are not described herein.

Figure 5:
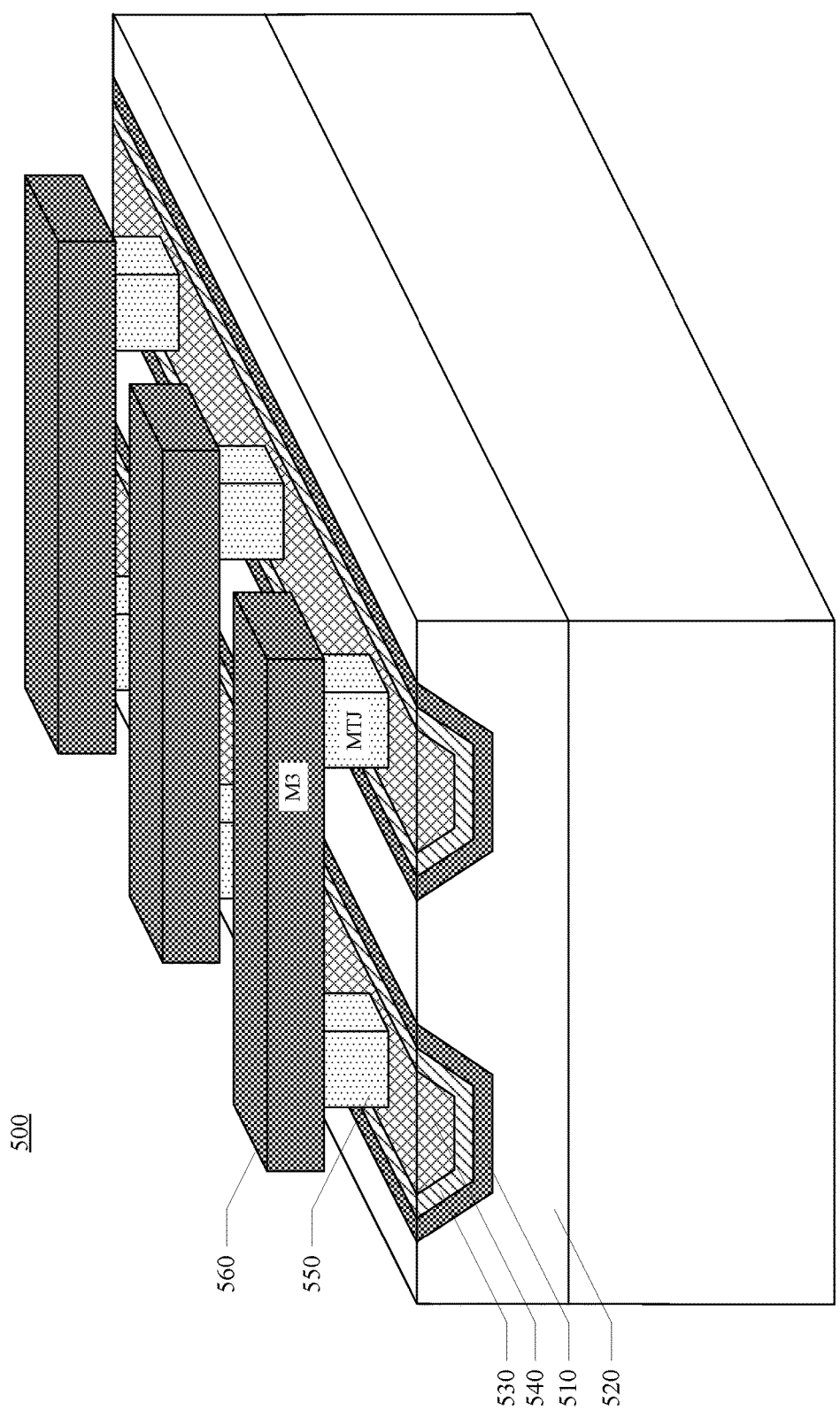
FIG. 5 shows a block diagram of a cell array of a Magnetic Tunnel Junction (MTJ) device, in accordance with aspects of the present technology.

Referring now to FIG. 5, a block diagram of a cell array of a Magnetic Tunnel Junction (MTJ) device, in accordance with aspects of the present technology, is shown. The MTJ device can be a MRAM, ST-MRAM or similar memory device. In some aspects, the cell array 500 can include a plurality of source line layers 410 disposed in columns. The source line layers 510 can be disposed in corresponding trenches in a dielectric layer 520 of a wafer. In one implementation, the plurality of source line layers 510 can include Copper (Cu), Tungsten (W) or other similar conductive material. For conductive material like Copper (Cu) which is characterized by a relatively high solubility and diffusivity in oxide, the plurality of source line layers 510 can also include a Titanium Nitride (TiN), a Tantalum Nitride (TaN), Titanium Nitride/Tantalum Nitride (TiN/TaN) or similar capping layer. In one example, the plurality of source line layers 510 can be a first metalization (M1) layer.

In some aspects, the cell array 500 can include an array of selectors 530. The array of selectors 530 can be disposed on respective source line layers 510 in the corresponding trenches in the dielectric layer 520. The selectors 530 can be two-terminal elements in which the conductivity of a given selector can be controlled by the potential voltage applied across the given selector. For example, the selector 530 can be in a low resistance state when a first voltage is applied across the given selector, and the selector can be in a high resistance state when a second voltage is applied across the given selector. In one implementation, the array of selectors 530 can include a Nickel Oxide (NiOx), Titanium Oxide (TiOx), or Vanadium Oxide (VOx) or other similar material.

In some aspects, the cell array 500 can include an array of buffers 540 disposed one respective selectors 530 in the corresponding trenches in the dielectric layer 520. The array of buffers 540 can provide a crystallization structure upon which MTJ structures 550 can be fabricate. The array of buffers 540 can also provide a separation for the MTJ structures 550 so that the array of selectors 530 have a reduced effect on the device characteristics of the MTJ structures 550. In one implementation, the array of buffers 540 can include Tantalum Nitride (TaN) or Titanium Nitride (TiN) or similar material. In one example, the array of buffers 540 can be a second metalization (M2) layer. In some aspects, a surface of the source line layers 410, a surface of the selectors 430 and a surface of the buffers 540 can be coplanar with a surface of the dielectric layer 520.

In some aspects, the cell array 500 can include an array of MTJ structures 550. The MTJ structures 550 can be coupled to respective buffers 540. The MTJ can include two magnetic layers and a magnetic tunnel barrier layer therebetween. One of the magnetic layers can have a fixed magnetization polarization, while the polarization of the magnetization of the other magnetic layer can switch between opposite directions. Typically, if the magnetic layers have the same magnetization polarization, the MTJ cell will exhibit a relatively low resistance value corresponding to a '1' bit state; while if the magnetization polarization between the two magnetic layers is antiparallel the MTJ cell will exhibit a relatively high resistance value corresponding to a '0' bit state. In one implementation, the MTJ structures 550 can include one or more first ferromagnetic layers, one or more non-magnetic layers disposed on the one or more first ferromagnetic layers, and one or more second ferromagnetic layers of a Synthetic Antiferromagnetic (SAF) portion of the MTJ. The MTJ structures 230 can also include one or more reference magnetic layers, one or more non-magnetic tunneling barrier layers disposed on the one or more reference magnetic layers, and one or more free magnetic layers disposed on the one or more non-magnetic tunneling barrier layers of a MTJ. Some or all of the one or more reference magnetic layers of the MTJ and some or all of the one or more second ferromagnetic layers of the SAF may be shared between both the MTJ and SAF portions of the MTJ structure. The MTJ structure 550 can also include one or more capping layers disposed on the free magnetic layer. In one implementation, a first ferromagnetic layer can include one or more of Cobalt (Co), Platinum (Pt), and Ruthenium (Ru), a first non-magnetic layer can include Magnesium Oxide (MgOx), a reference magnetic layer can include one or more of Cobalt (Co), Iron (Fe), and Boron (B), a non-magnetic tunneling barrier layer can include Magnesium Oxide (MgOx), and a free magnetic layer can include one or more of Cobalt (Co), Iron (Fe), Boron (B), and Tungsten (W). Each MTJ structure 550 may be implemented in a pillar, with one or more dielectric materials (not shown) disposed between the array of MTJ pillars. The MTJ structures 550 can also include one or more additional layers, such as one or more see layers, one or more antiferromagnetic (AFM) coupling layers, one or more ferromagnetic (FM) coupling layers, one or more Processional Spin Current (PSC) coupling layers, one or more Perpendicular Magnetic Anisotropy (PMA) layers, and the like.

In some aspects, the cell array 500 can include a plurality of bit lines 560 disposed in rows. The plurality of bit lines 560 can be coupled to respective sets of MTJ structures 550. In one implementation, the plurality of bit lines 560 can include Tantalum Nitride (TaN) or Titanium Nitride (TiN) or similar material. In one implementation, one or more dielectric materials (not shown) can be disposed between the rows of bit lines 560. In one example, the plurality of bit lines 560 can be a third metalization (M3) layer.

The cell array 400 of the MTJ device can include numerous other layers, structures, and the like that are not germane to an understanding of aspects of the present technology.

Therefore, the other layers, structures and the like of the MTJ device are not described herein.

In some aspects, the cell array 200, 300, 400 of the MTJ devices can advantageously be stacked on top of each other to implement vertical three-dimension (3D) memory architectures, such as cross-point MRAM, cross-point ST-MRAM and the like.

Figure 6:
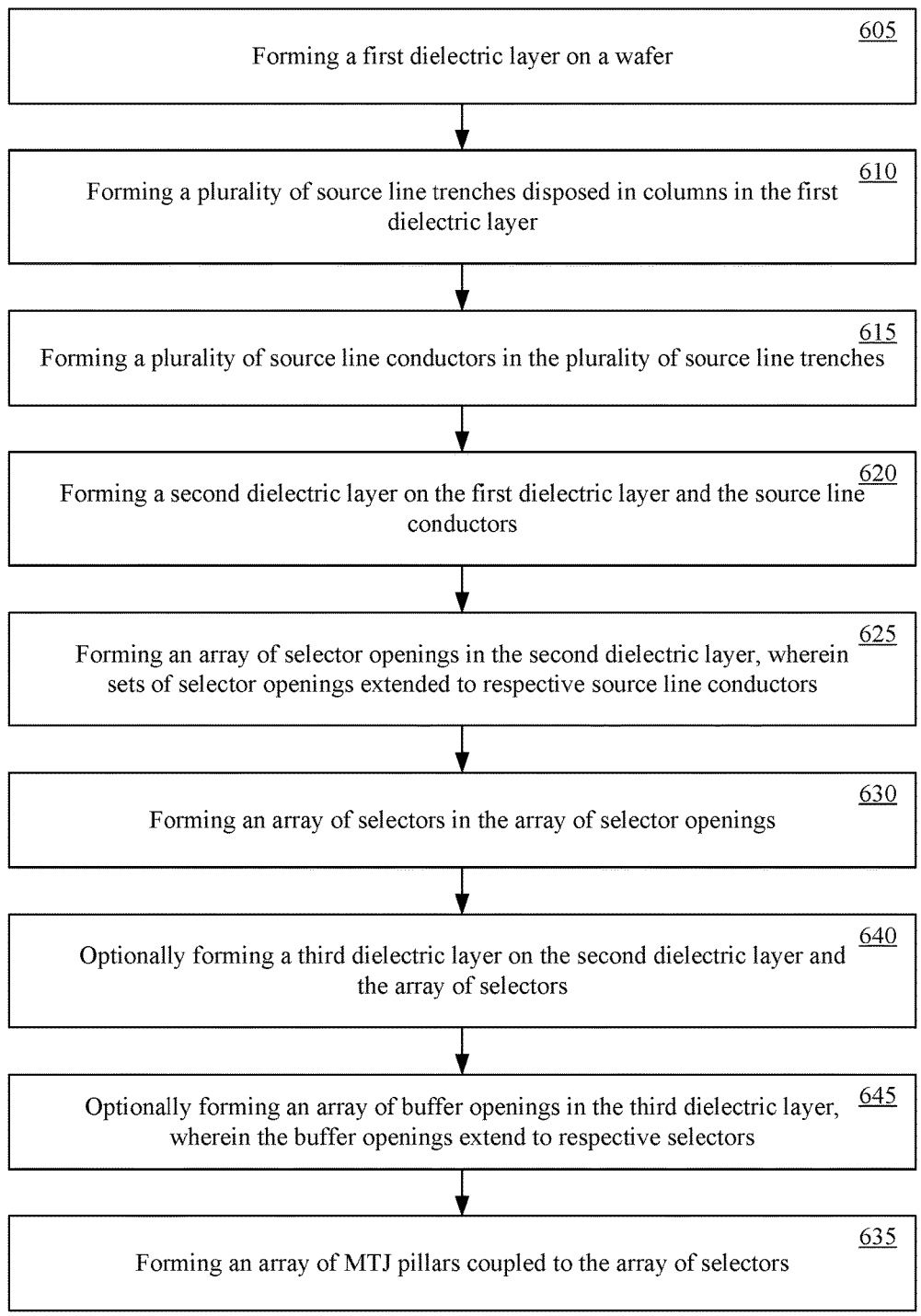
FIG. 6 shows a method of fabricating a Magnetic Tunnel Junction (MTJ) device, in accordance with aspects of the present technology.
Figure 7A:
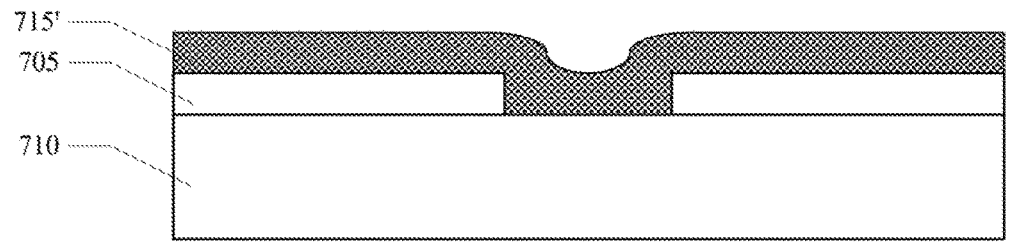
FIGS. 7A-7F illustrate method of fabricating a Magnetic Tunnel Junction (MTJ) device, in accordance with aspects of the present technology.
Figure 7B:
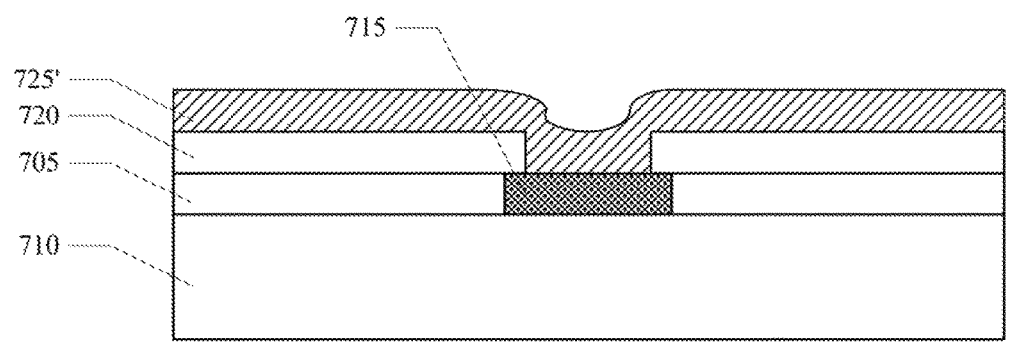
Figure 7C:
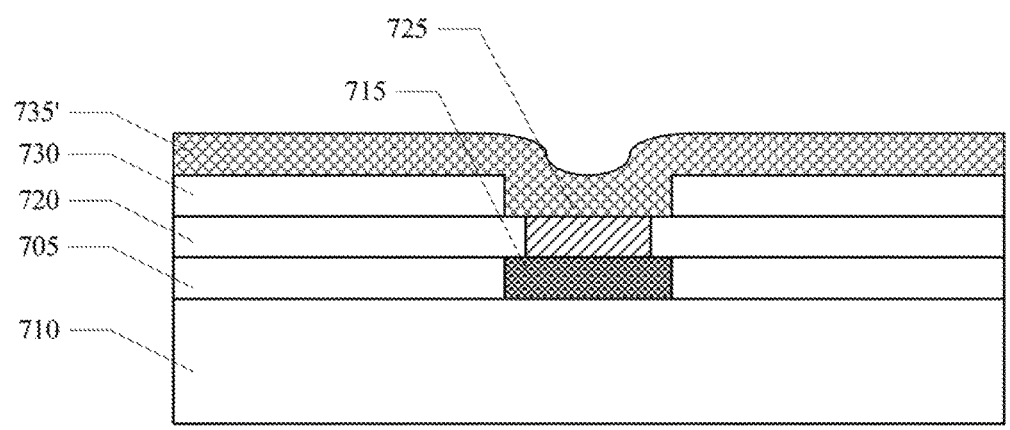
Figure 7D:
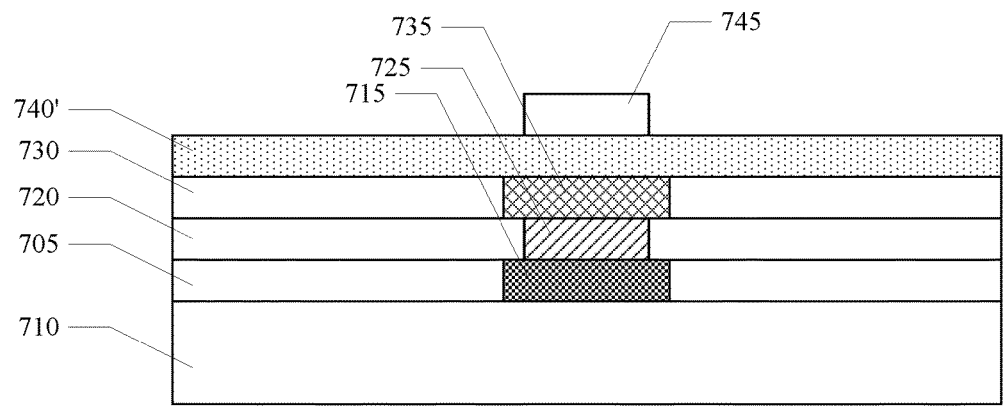
Figure 7E:
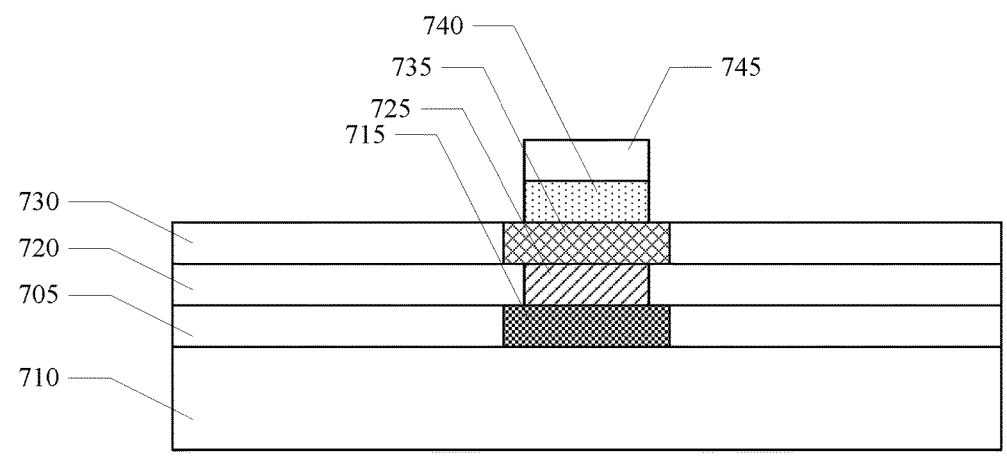
Figure 7F:
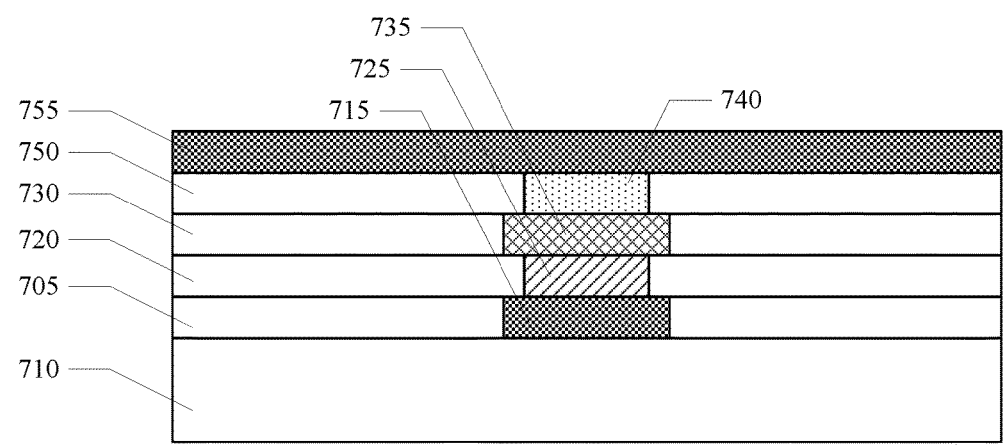

Referring now to FIG. 6, a method of fabricating a Magnetic Tunnel Junction (MTJ) device, in accordance with aspects of the present technology, is shown. The method of fabrication will be described with reference to FIGS. 7A-7F, which illustrate the method of fabrication. The MTJ device can be a Magnetoresistive Random Access Memory (MRAM), Spin Torque Magnetoresistive Random Access Memory (ST-MRAM) or similar memory device. In some aspects, a first dielectric layer 705 can be formed on a wafer 710, at 605. In one implementation, forming the first dielectric layer can include depositing a layer of Silicon Oxide (SiO), Silicon Nitride (SiN) or other similar material, with a thickness of approximately 10-100 nanometers (nm), by a process such as Chemical Vapor Deposition (CVD), Atomic Layer Deposition (ALD), Physical Vapor Deposition (PVD) or Plasma Enhanced Chemical Vapor Deposition or the like.

In some aspects, a plurality of source line trenches can be formed in columns in the first dielectric layer, at 610. In one implementation, the plurality of source line trenches can be formed by selectively etching the first dielectric layer exposed by a source line trench mask.

In some aspects, a plurality of source line conductors 715 can be formed in the plurality of source line trenches, at 615. In one implementation, forming the plurality of source line conductors can include depositing a first conductive layer 715' on the first dielectric layer 705 and filling the plurality of source line trenches. The first conductive layer can be Copper (Cu), Tungsten (W) or other similar conductor deposited by a process such as Physical Vapor Deposition (PVD), Atomic Layer Deposition (ALC) or the like. In addition, a first liner layer can be deposited on the first dielectric layer including the plurality of source line trenches before depositing the first conductive layer. For conductive material like Copper (Cu) which is characterized by a relatively high solubility and diffusivity in oxide, the first liner layer can be Titanium Nitride (TiN), Tantalum Nitride (TaN), Titanium Nitride/Tantalum Nitride (TiN/TaN) or similar material with a thickness of approximately 5-15 nm, by a process such as High-Density Plasma (HDP) deposition or the like. The first conductive layer can then be Chemical-Mechanical Polished (CMP) to remove the first conductive layer on the first dielectric layer and leaving the first conductive layer material in the plurality of source line trenches to form the plurality of source line conductors with a thickness of approximately 100-150 nm. The liner layer on the first dielectric layer can be utilized as a CMP stop. A surface of the source line conductors can be formed to be coplanar with a surface of the first dielectric layer as a result of the CMP process. In addition, a first capping layer can be deposited on the plurality first source line conductors after the CMP process. The first capping layer can be deposited by a process such as electroplating or the like. The first capping layer can be Titanium Nitride (TiN), Tantalum Nitride (TaN), Titanium Nitride/Tantalum Nitride (TiN/TaN) or similar material with a thickness of approximately 5-15 nm, to reduce solubility and diffusivity of the first source line conductor material into the first dielectric layer and other subsequently formed layers. The first capping layer material and thickness can be selected based upon a filing characteristic of the subsequent deposition of selector layer in the array of selector elements, and/or the CMP selectivity of the selector material over the capping layer material.

In some aspects, a second dielectric layer 720 can be formed on the first dielectric layer and the source line conductors, at 620. In one implementation, the second dielectric layer can be deposited on the first dielectric layer and the source line conductors by a process such as Chemical Vapor Deposition (CVD), Atomic Layer Deposition (ALD), Physical Vapor Deposition (PVD) or Plasma Enhanced Chemical Vapor Deposition or the like. The second dielectric layer can be Silicon Oxide (SiO), Silicon Nitride (SiN) with a thickness of approximately about 50 nm.

In some aspects, an array of selector openings can be formed in the second dielectric layer, at 625. Sets of the selector opening can extended to respective source line conductors. In one implementation, the array of selector openings can be formed by selectively etching the second dielectric layer exposed by a selector opening mask.

In some aspects, an array of selectors 725 can be formed in the selector openings 630. In one implementation, forming the array of selectors can include depositing a selector layer 725' on the second dielectric layer and filling the array of selector openings. The selector layer can be a Nickel Oxide (NiOx), Titanium Oxide (TiOx), or Vanadium Oxide (VOx) or other similar material deposited by a process such as sputtering or the like. Sputtering of the selector material can be performed in the presence of a strong electromagnetic fields to confine charge plasma particles close to the surface of the plurality of source line conductor targets. Depending on a design current density and rectifying ratio, the thickness of the selector material can composition of the selector material can be tuned and modified. Post-deposition morphology may not be smooth due to the via structure of the selector. The selector layer can then be CMP to remove the selector layer on the second dielectric layer and leaving the selector layer material in the array of selector opening to form the array of selectors with a thickness of approximately 30-50 nm. The slurry, pad pressure and speed can be selected to achieve a good selective removal rate of the selector material over the second dielectric material. The good selectivity can minimize loss of stack height. A surface of the selectors can be coplanar with a surface of the second dielectric layer as a result of the CMP process. In addition, a second capping layer can be deposited on the array of selectors after the CMP process. The second capping layer can be deposited by a process such as electroplating or the like. The second capping layer can be Titanium Nitride (TiN), Tantalum Nitride (TaN), Titanium Nitride/Tantalum Nitride (TiN/TaN) or similar material with a thickness of approximately 5-70 nm, to reduce solubility and diffusivity of the selector material into the second dielectric layer and other subsequently formed layers.

In some aspects, an optional third dielectric layer 730 can be formed on the second dielectric layer and the array of selectors, at 635. In one implementation, the third dielectric layer can be deposited on the second dielectric layer and the array of selectors by a process such as Chemical Vapor Deposition (CVD), Atomic Layer Deposition (ALD), Physical Vapor Deposition (PVD) or Plasma Enhanced Chemical Vapor Deposition or the like. The third dielectric layer can be Silicon Oxide (SiO), Silicon Nitride (SiN) with a thickness of approximately 40-60 nm.

In some aspects, optionally an array of buffer opening in the third dielectric layer can be formed, at 640. The buffer openings can extend to respective selectors. In one implementation, the array of buffer openings can be formed by selectively etching the third dielectric layer exposed by a buffer opening mask.

In some aspects, an optional array of buffers 735 can be formed in the array of buffer openings when the optional array of buffer openings are formed in the optional third dielectric layer, at 645. In one implementation, forming the array of buffers can include depositing a buffer layer 735' on the third dielectric layer and filling the array of buffer openings. The buffer layer can be Tantalum Nitride (TaN) or other similar material deposited by a process such as High-Density Plasma (HDP) deposition or the like. The buffer layer can then be CMP to remove the buffer layer on the third dielectric layer and leaving the buffer layer material in the array of buffer opening to form the array of buffers with a thickness of approximately 50 nm. A surface of the buffers can be coplanar with a surface of the third dielectric layer as a result of the CMP process. Forming array of buffers before forming the array of MTJs advantageously allows the fabrication of the MTJs without the processes used for forming the selectors affecting the performance parameters of the MTJs.

In some aspects, an array of MTJ pillars 740 can be formed, at 650. The MTJ pillars can be coupled directly to the array of selectors, or through the array of optional buffers to the array of selectors. In one implementation, a reference magnetic layer can be formed over the first barrier layer. A non-magnetic tunneling barrier layer can be formed over the reference magnetic layer. A free magnetic layer can be formed over the non-magnetic tunneling barrier layer. An array of pillars can be formed from the free magnetic layer, the non-magnetic tunnel barrier layer, and the reference magnetic layer by selective etching the free magnetic layer, the non-magnetic tunnel barrier layer, and the reference magnetic layer exposed by one or more pillar masks 745.

Fabrication can continue with forming a fourth dielectric layer 750 and forming a plurality of bit lines 755 disposed in rows and coupled to the MTJ pillars 740. The fabrication of the MTJ device can include numerous other processes that are not germane to an understanding of aspect of the present technology. Therefore, the other processes of fabricating the MTJ device are not described herein.

In some aspects, multiple cell arrays can be fabricated in stacks on top of each other to implement vertical three-dimension (3D) memory architectures, such as cross-point MRAM, cross-point ST-MRAM and the like. The stacked arrays can be formed by repeating the above described processes to form multiple cell arrays stacked upon each other.

Figure 8A:
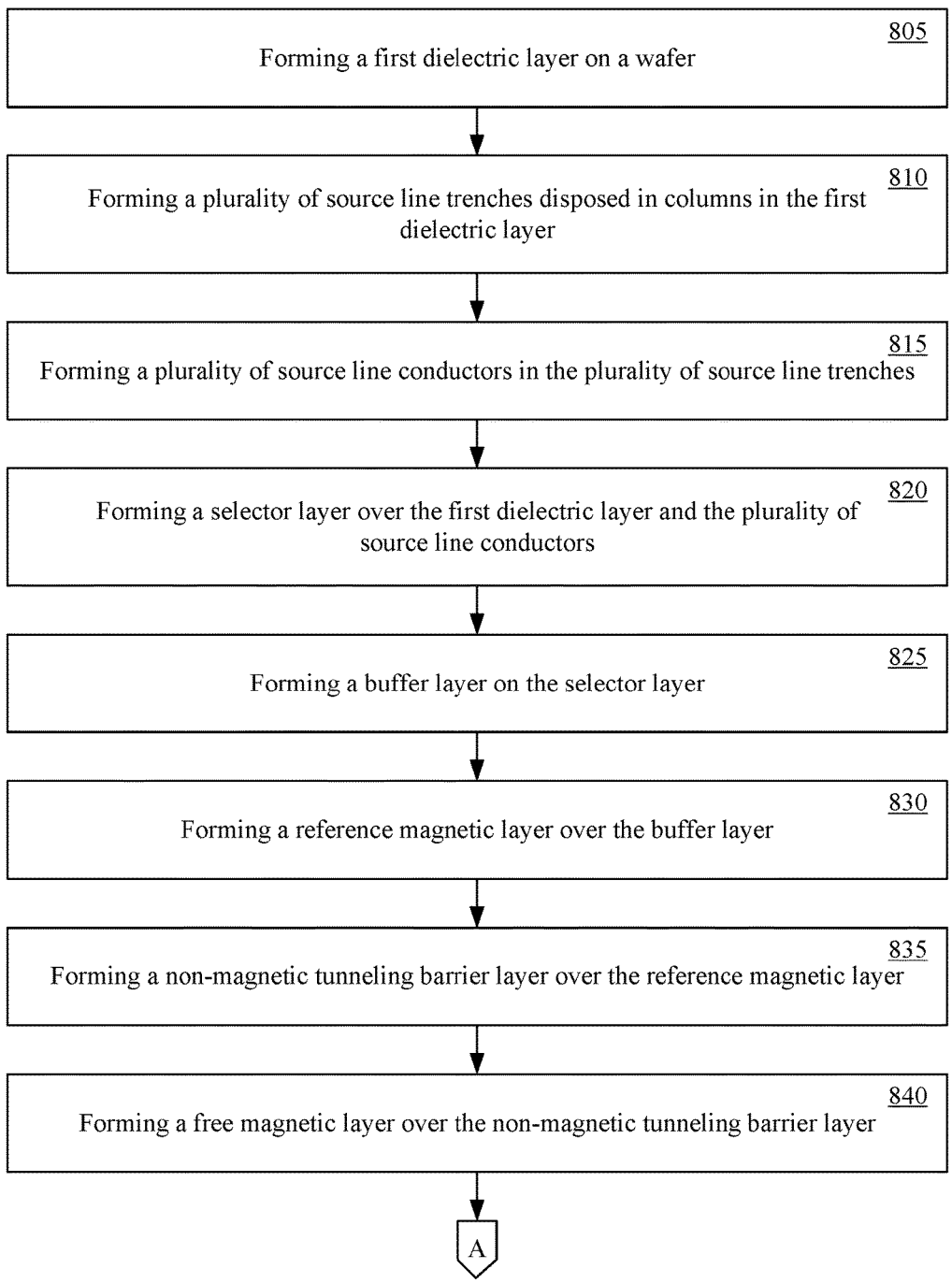
FIGS. 8A-8B show a method of fabricating a Magnetic Tunnel Junction (MTJ) device, in accordance with aspects of the present technology.
Figure 8B:
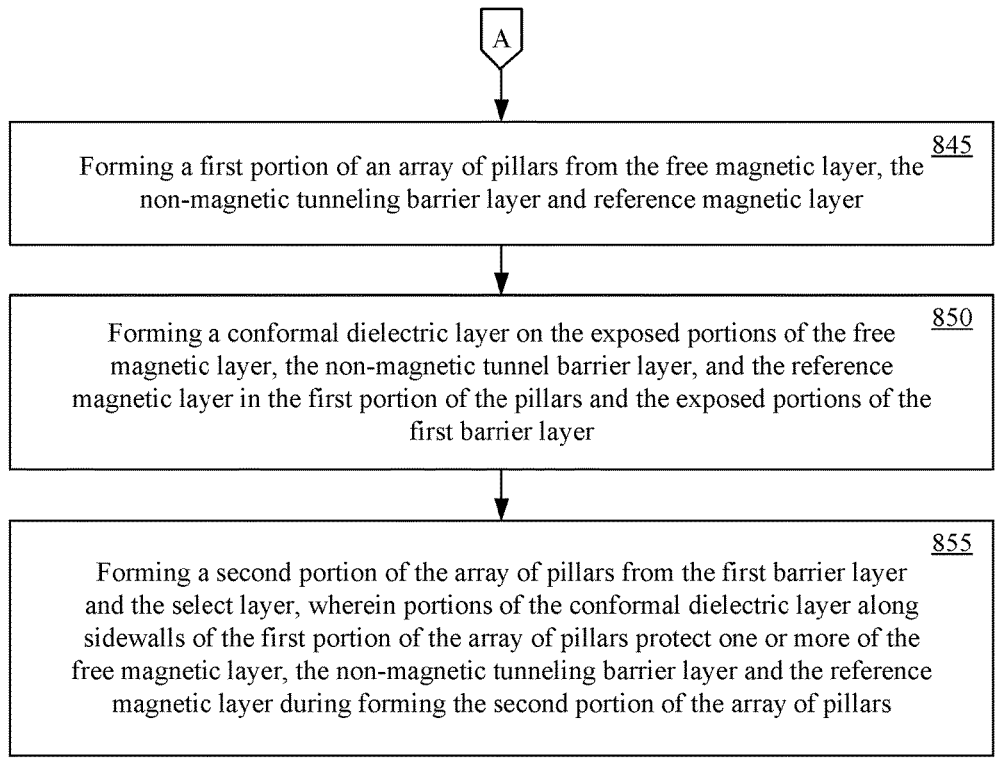
Figure 9A:
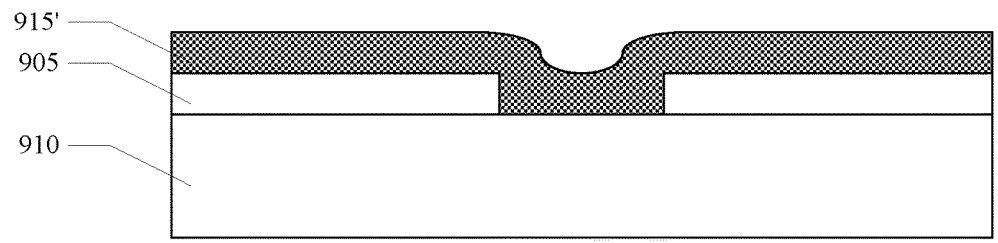
FIGS. 9A-9G illustrate method of fabricating a Magnetic Tunnel Junction (MTJ) device, in accordance with aspects of the present technology.
Figure 9B:
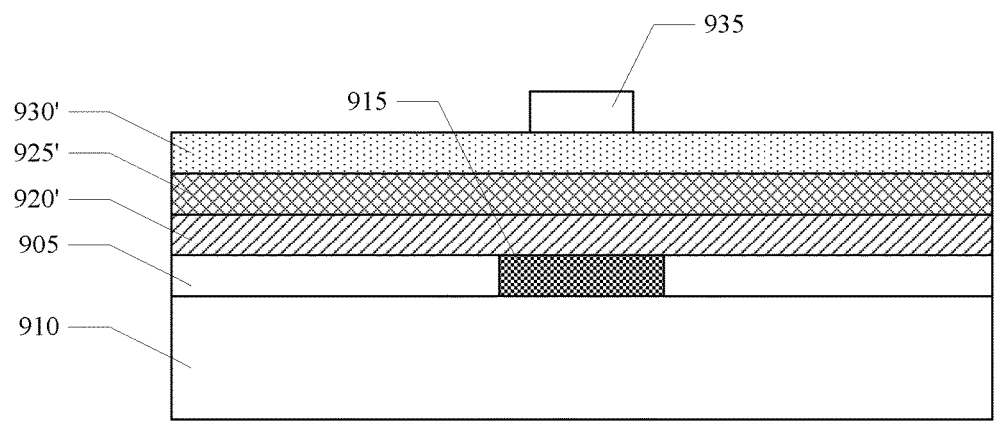
Figure 9C:
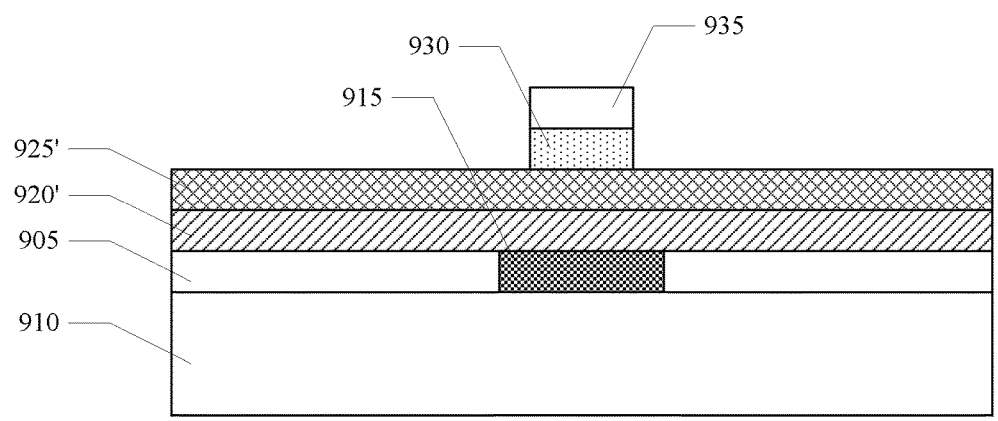
Figure 9D:
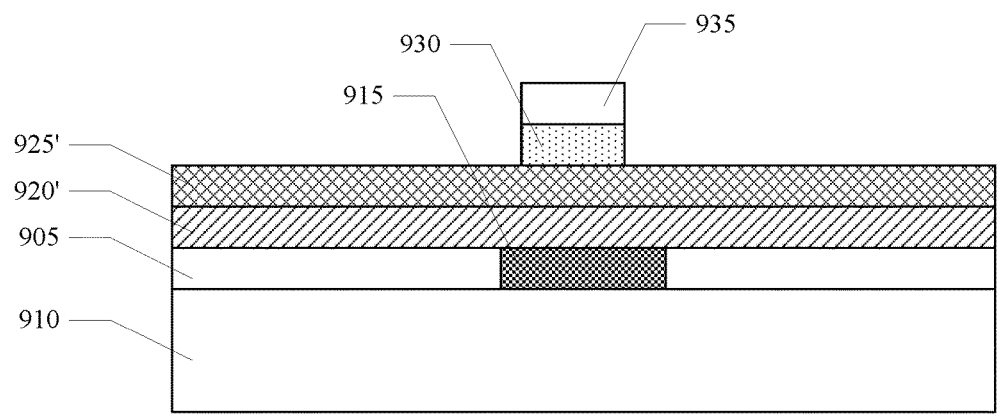
Figure 9E:
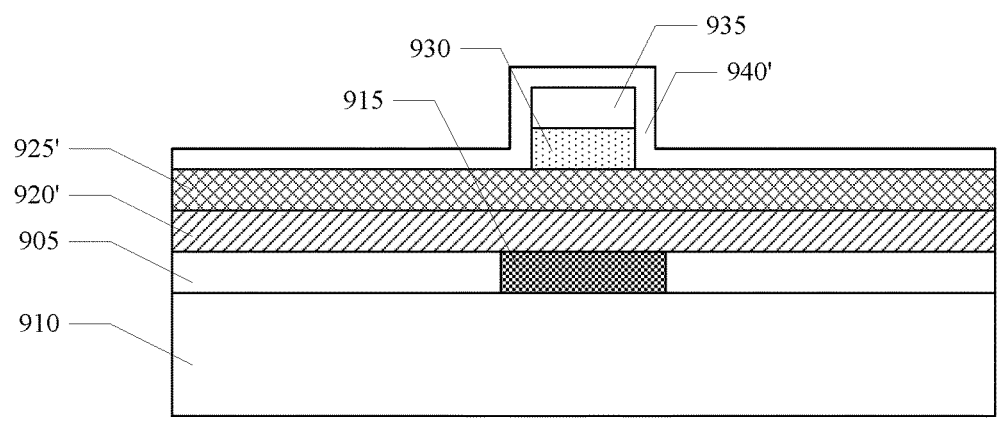
Figure 9F:
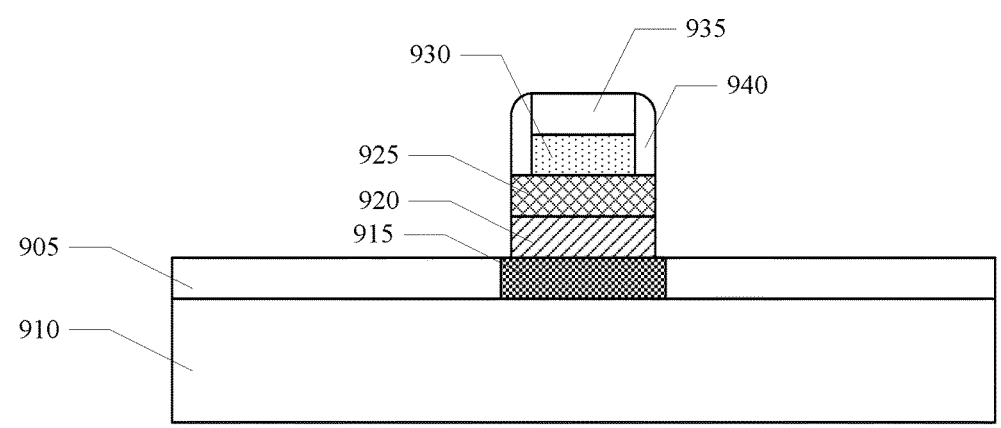
Figure 9G:
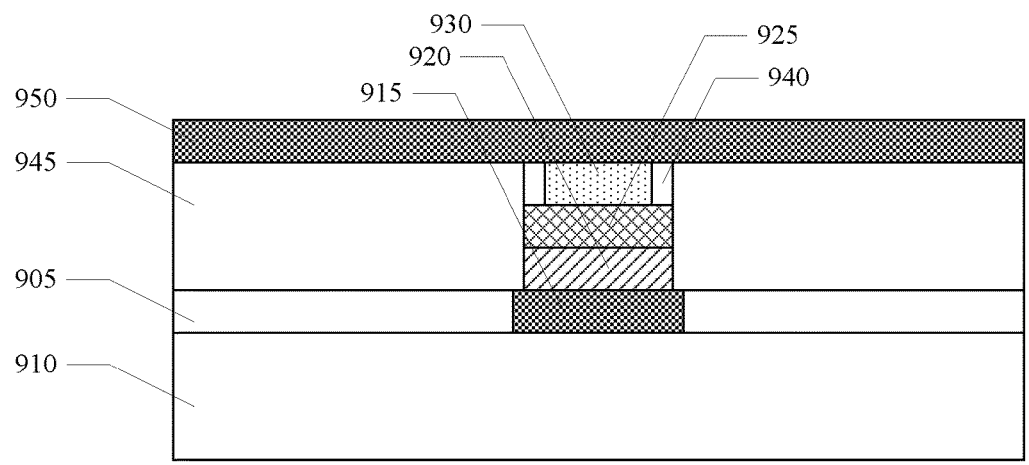

Referring now to FIGS. 8A-8B, a method of fabricating a Magnetic Tunnel Junction (MTJ) device, in accordance with aspects of the present technology, is shown. The method of fabrication will be described with reference to FIGS. 9A-9G, which illustrate the method of fabrication. The MTJ device can be a MRAM, ST-MRAM or similar memory device. In some aspects, a first dielectric layer 905 can be formed on a wafer 910, at 805. In one implementation, forming the first dielectric layer can include depositing a layer of Silicon Oxide (SiO), Silicon Nitride (SiN) or other similar material, with a thickness of approximately 40-60 nm, by a process such as Chemical Vapor Deposition (CVD), Atomic Layer Deposition (ALD), Physical Vapor Deposition (PVD) or Plasma Enhanced Chemical Vapor Deposition or the like.

In some aspects, a plurality of source line trenches can be formed in columns in the first dielectric layer, at 810. In one implementation, the plurality of source line trenches can be formed by selectively etching the first dielectric layer exposed by a source line trench mask.

In some aspect, a plurality of source line conductors 915 can be formed in the plurality of source line trenches, at 815. In one implementation, forming the plurality of source line conductors can include depositing a first conductive layer 915' on the first dielectric layer 905 and filling the plurality of source line trenches. The first conductive layer can be Copper (Cu), Tungsten (W) or other similar conductor deposited by a process such as ??? or the like. In addition, a first liner layer can be deposited on the first dielectric layer including the plurality of source line trenches before depositing the first conductive layer. For conductive material like Copper (Cu) which is characterized by a relatively high solubility and diffusivity in oxide, the first liner layer can be Titanium Nitride (TiN), Tantalum Nitride (TaN), Titanium Nitride/Tantalum Nitride (TiN/TaN) or similar material with a thickness of approximately 5-15 nm, by a process such as High-Density Plasma (HDP) deposition or the like. The first conductive layer can then be Chemical-Mechanical Polished (CMP) to remove the first conductive layer on the first dielectric layer and leaving the first conductive layer material in the plurality of source line trenches to form the plurality of source line conductors with a thickness of approximately 100-150 nm. The liner layer on the first dielectric layer can be utilized as a CMP stop. A surface of the source line conductors can be formed to be coplanar with a surface of the first dielectric layer as a result of the CMP process. In addition, a first capping layer can be deposited on the plurality source line conductors after the CMP process. The first capping layer can be deposited by a process such as electroplating or the like. The first capping layer can be Titanium Nitride (TiN), Tantalum Nitride (TaN), Titanium Nitride/Tantalum Nitride (TiN/TaN) or similar material with a thickness of approximately 5-15 nm, to reduce solubility and diffusivity of the source line conductor material into the first dielectric layer and other subsequently formed layers. The first capping layer material and thickness can be selected based upon a filing characteristic of the subsequent deposition of selector layer in the array of selector elements, and/or the CMP selectivity of the selector material over the capping layer material.

In some aspects, a selector layer 920' can be formed over the first dielectric layer and the plurality of source line conductors, at 820. In one implementation, the selector layer can be formed by depositing a layer of Nickel Oxide (NiOx), Titanium Oxide (TiOx), or Vanadium Oxide (VOx) or other similar material, with a thickness of approximately 50 nm, by a process such as sputtering or the like. Sputtering of the selector material can be performed in the presence of a strong electromagnetic fields to confine charge plasma particles close to the surface of the target. Depending on a design current density and rectifying ratio, the thickness of the selector material can composition of the selector material can be tuned and modified. Post-deposition morphology may not be smooth due to the via structure of the selector.

In some aspects, a first buffer layer 925' can be formed on the selector layer, at 825. In one implementation, the buffer layer can be formed by deposit a layer of Tantalum Nitride (TaN) or other similar material, with a thickness of approximately 50-100 nm, by a process such as High-Density Plasma (HDP) deposition or the like. The array of buffers disposed between the array of selectors and the subsequently formed array of MTJs advantageously allow the fabrication of the MTJs without the processes used for forming the selectors affecting the performance parameters of the MTJs.

In some aspects, a reference magnetic layer can be formed over the first barrier layer, 830. In one implementation, the reference magnetic layer can be formed by depositing a layer of Cobalt-Iron-Boron (Co—Fe—B) alloy or other similar material, with a thickness of approximately 1-5 nm, by a process such as Physical Vapor Deposition (PVD) or the like.

In some aspects, a non-magnetic tunneling barrier layer can be formed over the reference magnetic layer, at 835. In one implementation, the non-magnetic tunneling barrier layer can be formed by depositing a layer of Magnesium Oxide (MgOx) or other similar material, with a thickness of approximately 0.1-1 nm, by a process such as sputtering or the like.

In some aspects, a free magnetic layer can be formed over the non-magnetic tunneling barrier layer, at 840. In one implementation, the free magnetic layer can be formed by depositing a layer of Cobalt-Iron-Boron (Co—Fe—B) alloy or other similar material, with a thickness of approximately 0.5-2 nm, by a process such as Physical Vapor Deposition (PVD) or the like.

In some aspects, a first portion of an array of pillars 930 can be formed from the free magnetic layer, the non-magnetic tunnel barrier layer, and the reference magnetic layer, at 845. In one implementation, the first portion of the array of pillars can be formed by selectively etching the free magnetic layer, the non-magnetic tunnel barrier layer, and the reference magnetic layer exposed by one or more pillar masks 935.

In some aspects, a conformal dielectric layer 945' can be formed on the exposed portion of the free magnetic layer, the non-magnetic tunnel barrier layer, and the reference magnetic layer in the first portion of the pillars and the exposed portion of the first barrier layer, at 850. In one implementation, the conformal dielectric layer can be formed by depositing a layer of Silicon Oxide (SiO), Silicon Nitride (SiN) or other similar material, with a thickness of approximately 50 nm, by a process such as Chemical Vapor Deposition (CVD), Atomic Layer Deposition (ALD), Physical Vapor Deposition (PVD) or Plasma Enhanced Chemical Vapor Deposition or the like.

In some aspects, a second portion of the array of pillars can be formed from the first barrier layer and the select layer, at 855. In one implementation, portions of the conformal dielectric layer 940' on the exposed portion of the first barrier layer, the exposed portions of the barrier layer 925, and the exposed portions of the select layer 920 can be selectively etched to form the second portion of the array of pillars. Portions of the conformal dielectric layer 940 along sidewalls of the first portion of the array of pillars can protect one or more of the free magnetic layer, the non-magnetic tunneling barrier layer and the reference magnetic layer during forming the second portion of the array of pillars. The dielectric layer 940 along the sidewalls of the first portion of the array of pillars can prevent re-deposition of the barrier layer and/or select layer on the free magnetic, the non-magnetic tunnel barrier layer, and/or the reference magnetic layer, and/or contamination thereof during the etching process.

Fabrication can continue with forming a second dielectric layer 945 and forming a plurality of bit lines 950 disposed in rows and coupled to the MTJ pillars 930. The fabrication of the MTJ device can include numerous other processes that are not germane to an understanding of aspect of the present technology. Therefore, the other processes of fabricating the MTJ device are not described herein.

In some aspects, multiple cell arrays can be fabricated in stacks on top of each other to implement vertical three-dimension (3D) memory architectures, such as cross-point MRAM, cross-point ST-MRAM and the like. The stacked arrays can be formed by repeating the above described processes to form multiple cell arrays stacked upon each other.

Figure 10A:
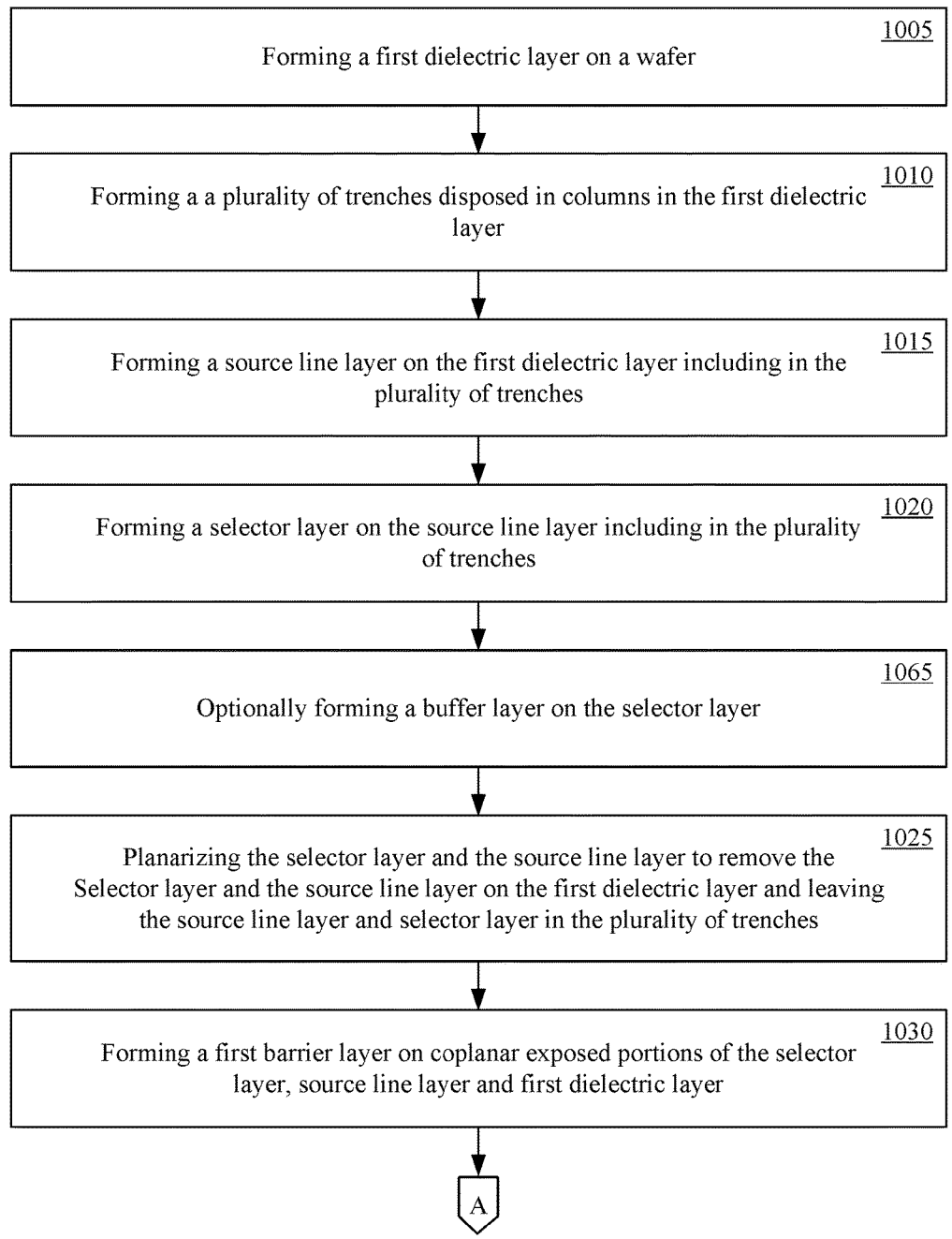
FIGS. 10A-10B show a method of fabricating a Magnetic Tunnel Junction (MTJ) device, in accordance with aspects of the present technology.
Figure 10B:
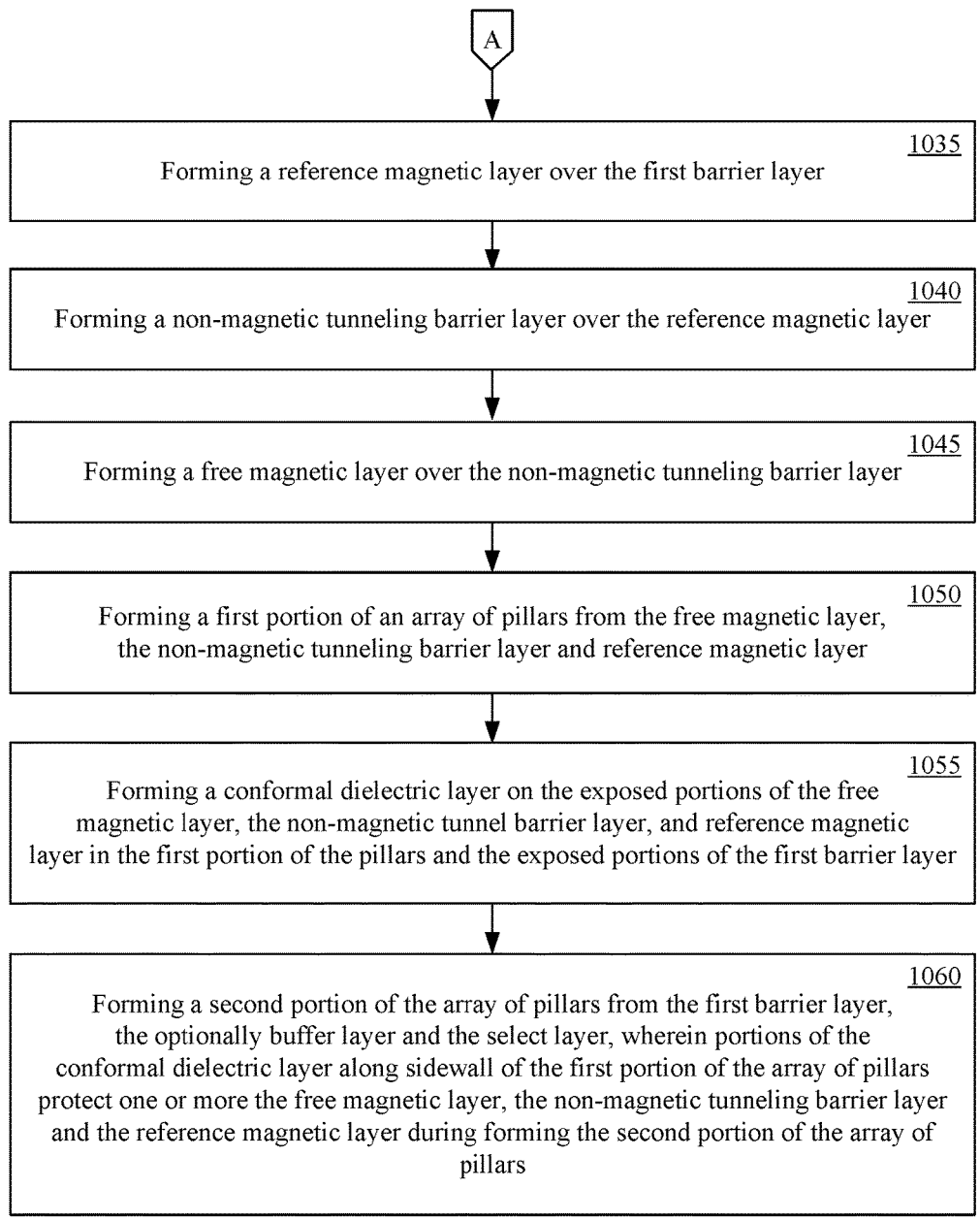
Figure 11A:
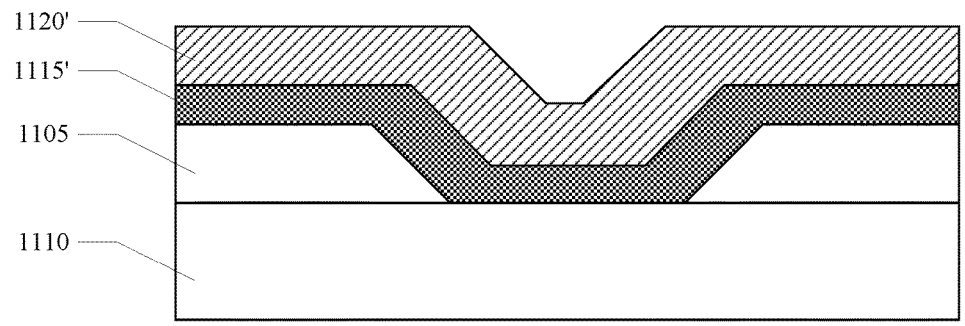
FIGS. 11A-11F illustrate method of fabricating a Magnetic Tunnel Junction (MTJ) device, in accordance with aspects of the present technology.
Figure 11B:
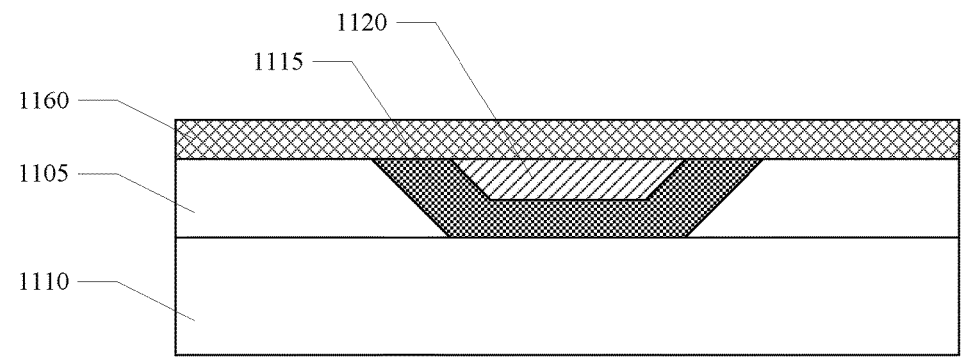
Figure 11C:
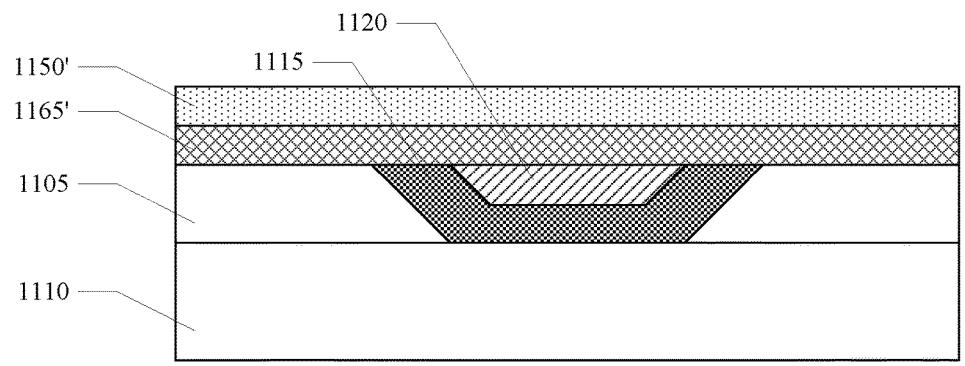
Figure 11D:
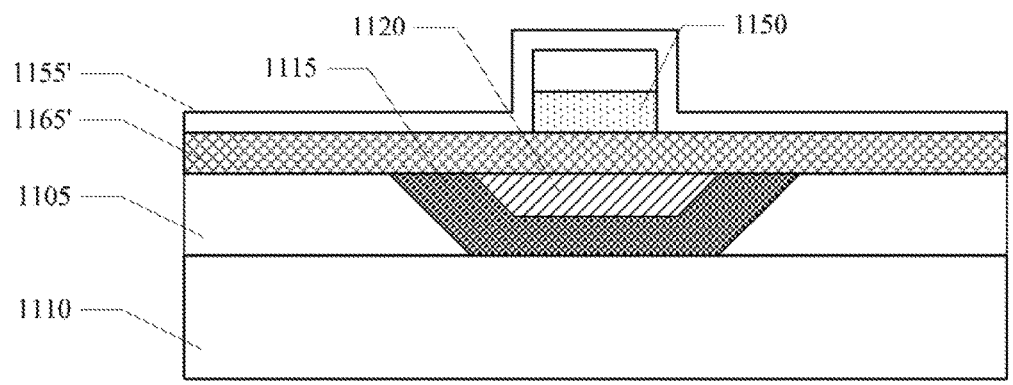
Figure 11E:
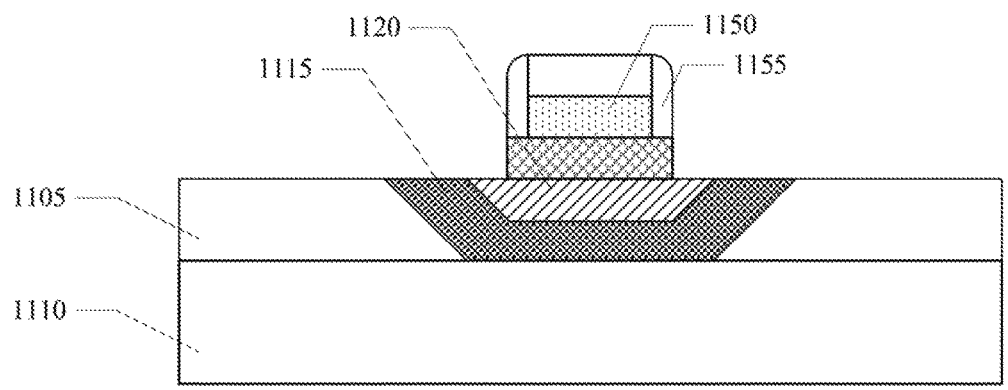
Figure 11F:
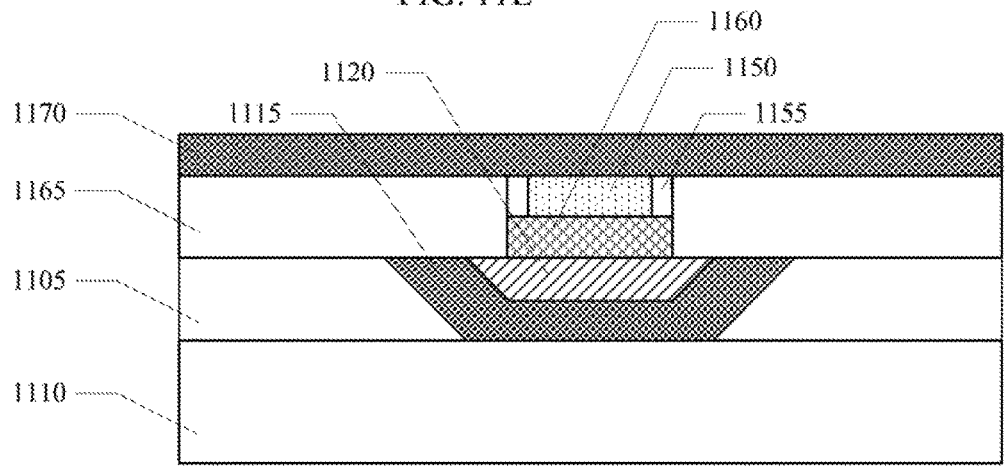

Referring now to FIGS. 10A-10B, a method of fabricating a Magnetic Tunnel Junction (MTJ) device, in accordance with aspects of the present technology, is shown. The method of fabrication will be described with reference to FIGS. 11A-11F, which illustrate the method of fabrication. The MTJ device can be a Magnetoresistive Random Access Memory (MRAM), Spin Torque Magnetoresistive Random Access Memory (ST-MRAM) or similar memory device. In some aspect, a first dielectric layer 1105 can be formed on a wafer 1110, at 1005. In one implementation, forming the first dielectric layer can include depositing a layer of Silicon Oxide (SiO), Silicon Nitride (SiN) or other similar material, with a thickness of approximately 40-60 nm, by a process such as Chemical Vapor Deposition (CVD), Atomic Layer Deposition (ALD), Physical Vapor Deposition (PVD) or Plasma Enhanced Chemical Vapor Deposition or the like.

In some aspects, a plurality of trenches can be formed in columns in the first dielectric layer, at 1010. In one implementation, the plurality of trenches can be formed by selectively etching the first dielectric layer exposed by a trench mask.

In some aspects, a source line layer 1115' can be formed on the first dielectric layer including in the plurality of trenches, at 1015. In one implementation, forming the first source line layer can include depositing a layer of Copper (Cu), Tungsten (W) or other similar material, with a thickness of approximately 100-150 nm, by a process such as Atomic Layer Deposition (ALD) or the like.

In some aspects, a select layer 1120' can be formed on the source line layer including in the plurality of trenches, at 1020. In one implementation, the selector layer can be formed by depositing a layer of Nickel Oxide (NiOx), Titanium Oxide (TiOx), or Vanadium Oxide (VOx) or other similar material, with a thickness of approximately 50 nm, by a process such as sputtering or the like. Sputtering of the selector material can be performed in the presence of a strong electromagnetic fields to confine charge plasma particles close to the surface of the target. Depending on a design current density and rectifying ratio, the thickness of the selector material can composition of the selector material can be tuned and modified. Post-deposition morphology may not be smooth due to the via structure of the selector.

In some aspects, the select layer 1115' and the source line layer 1120' can be planarized to remove the selector layer and the source line layer on the first dielectric layer and leaving selector layer material and source line layer material in the plurality of trenches 1025. In one implementation, the select layer and the source line layer can be CMPed to remove the selector layer and the source line layer on the first dielectric layer and leaving selector layer material and source line layer material in the plurality of trenches. After CMPing the portions of the selectors, the source lines and the first dielectric layer can be coplanar.

In some aspects, a first barrier layer can be formed on the coplanar exposed portions of the select layer, source line layer and first dielectric layer, at 1030. In one implementation, the first barrier layer can be formed by deposit a layer of Tantalum Nitride (TaN) or other similar material, with a thickness of approximately 50-100 nm, by a process such as High-Density Plasma (HDP) deposition or the like.

In some aspects, a reference magnetic layer can be formed over the first barrier layer, 1035. In one implementation, the reference magnetic layer can be formed by depositing a layer of Cobalt-Iron-Boron (Co—Fe—B) alloy or other similar material, with a thickness of approximately 1-5 nm, by a process such as Physical Vapor Deposition (PVD) or the like.

In some aspects, a non-magnetic tunneling barrier layer can be formed over the reference magnetic layer, at 1040. In one implementation, the non-magnetic tunneling barrier layer can be formed by depositing a layer of Magnesium Oxide (MgOx) or other similar material, with a thickness of approximately 0.1-1 nm, by a process such as sputtering or the like.

In some aspects, a free magnetic layer can be formed over the non-magnetic tunneling barrier layer, at 1045. In one implementation, the free magnetic layer can be formed by depositing a layer of Cobalt-Iron-Boron (Co—Fe—B) alloy or other similar material, with a thickness of approximately 0.5-2 nm, by a process such as Physical Vapor Deposition (PVD) or the like.

In some aspects, a first portion of an array of pillars 1050 can be formed from the free magnetic layer, the non-magnetic tunnel barrier layer, and the reference magnetic layer, at 1050. In one implementation, the first portion of the array of pillars can be formed by selectively etching the free magnetic layer, the non-magnetic tunnel barrier layer, and the reference magnetic layer exposed by one or more pillar masks.

In some aspects, a conformal dielectric layer 1155 can be formed on the exposed portion of the free magnetic layer, the non-magnetic tunnel barrier layer, and the reference magnetic layer in the first portion of the pillars and the exposed portion of the first barrier layer, at 1055. In one implementation, the conformal dielectric layer can be formed by depositing a layer of Silicon Oxide (SiO), Silicon Nitride (SiN) or other similar material, with a thickness of approximately 50 nm, by a process such as Chemical Vapor Deposition (CVD), Atomic Layer Deposition (ALD), Physical Vapor Deposition (PVD) or Plasma Enhanced Chemical Vapor Deposition or the like.

In some aspects, a second portion of the array of pillars 1160 can be formed from the first barrier layer and the select layer, at 1060. In one implementation, portions of the conformal dielectric layer on the exposed portion of the first barrier layer, the exposed portions of the barrier layer, and the exposed portions of the select layer can be selectively etched to form the second portion of the array of pillars. Portions of the conformal dielectric layer along sidewalls of the first portion of the array of pillars can protect one or more of the free magnetic layer, the non-magnetic tunneling barrier layer and the reference magnetic layer during forming the second portion of the array of pillars. The dielectric layer along the sidewalls of the first portion of the array of pillars can prevent re-deposition of the barrier layer and/or select layer on the free magnetic, the non-magnetic tunnel barrier layer, and/or the reference magnetic layer, and/or contamination thereof during the etching process.

In some aspects, a buffer layer can optionally be formed on the selector layer before forming the first barrier layer over the selector layer, at 1065. In one implementation, the buffer layer can be formed by depositing a layer of Tantalum Nitride (TaN) or other similar material, with a thickness of approximately 50 nm, by a process such as High-Density Plasma (HDP) deposition or the like. When a buffer layer is formed on the selector layer, the second portion of the array of pillars can be formed from the buffer layer, the barrier layer and the selector layer, at 1060. The array of buffers disposed between the array of selectors and the subsequently formed array of MTJs advantageously allow the fabrication of the MTJs without the processes used for forming the selectors affecting the performance parameters of the MTJs. The array of buffers disposed between the array of selectors and the subsequently formed array of MTJs advantageously allow the fabrication of the MTJs without the processes used for forming the selectors affecting the performance parameters of the MTJs.

Fabrication can continue with forming a second dielectric layer 1165 and forming a plurality of bit lines 1170 disposed in rows and coupled to the MTJ pillars 150. The fabrication of the MTJ device can include numerous other processes that are not germane to an understanding of aspect of the present technology. Therefore, the other processes of fabricating the MTJ device are not described herein.

In some aspects, multiple cell arrays can be fabricated in stacks on top of each other to implement vertical three-dimension (3D) memory architectures, such as cross-point MRAM, cross-point ST-MRAM and the like. The stacked arrays can be formed by repeating the above described processes to form multiple cell arrays stacked upon each other.

Figure 12A:
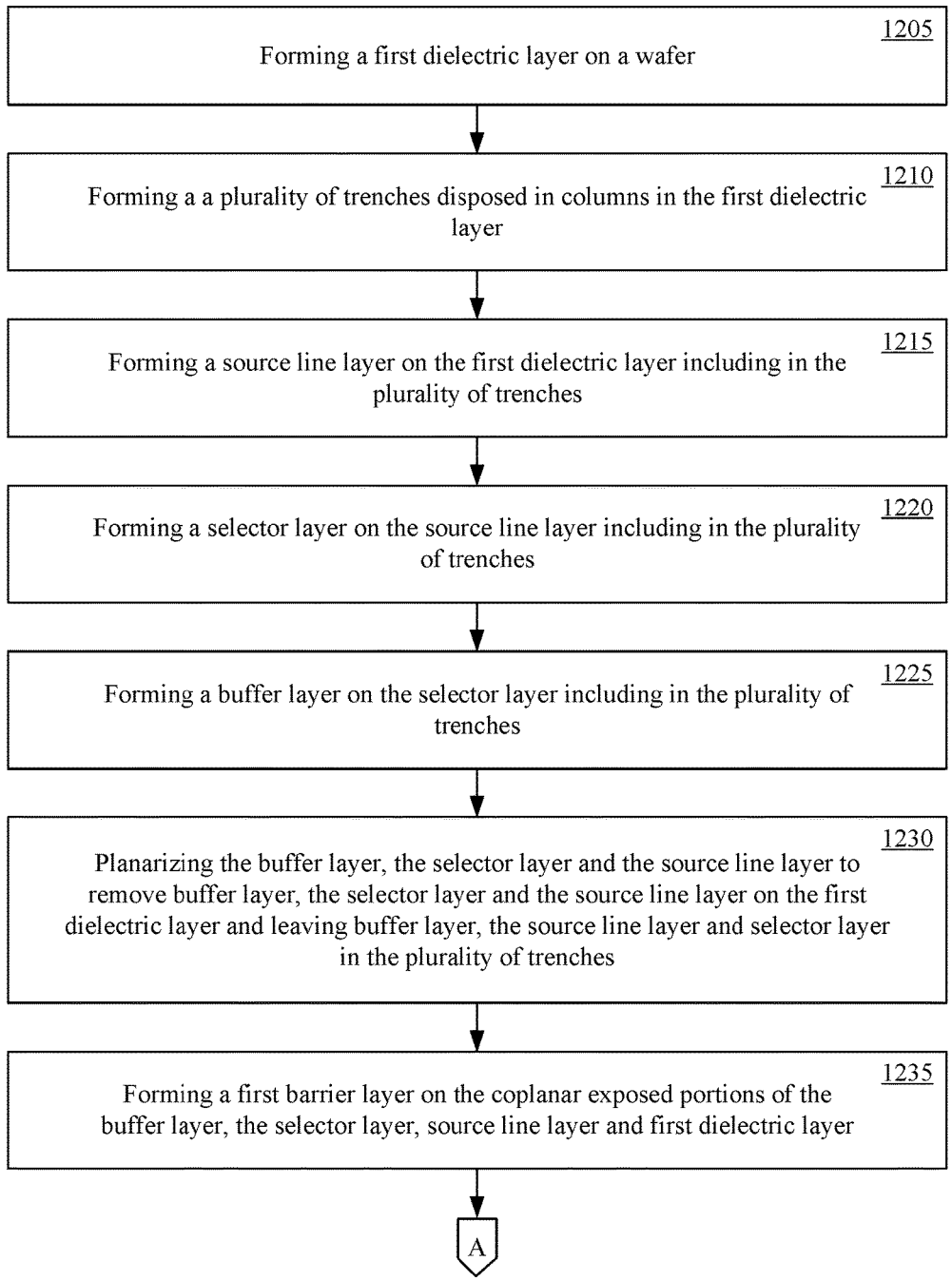
FIGS. 12A-12B show a method of fabricating a Magnetic Tunnel Junction (MTJ) device, in accordance with aspects of the present technology.
Figure 12B:
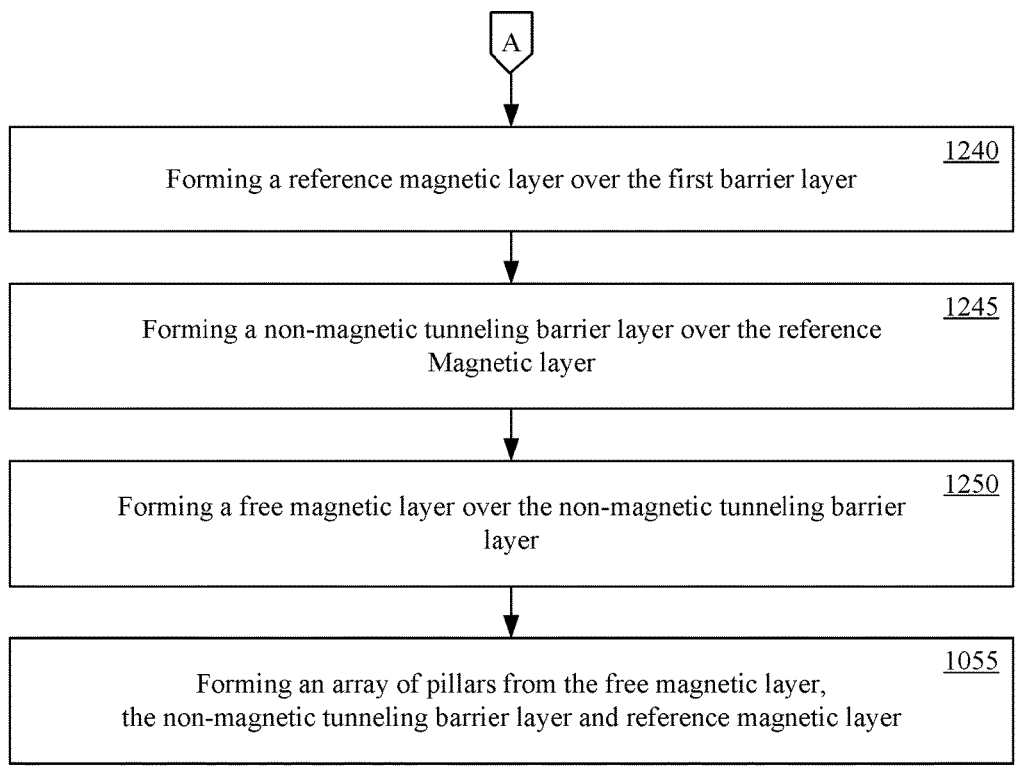
Figure 13A:
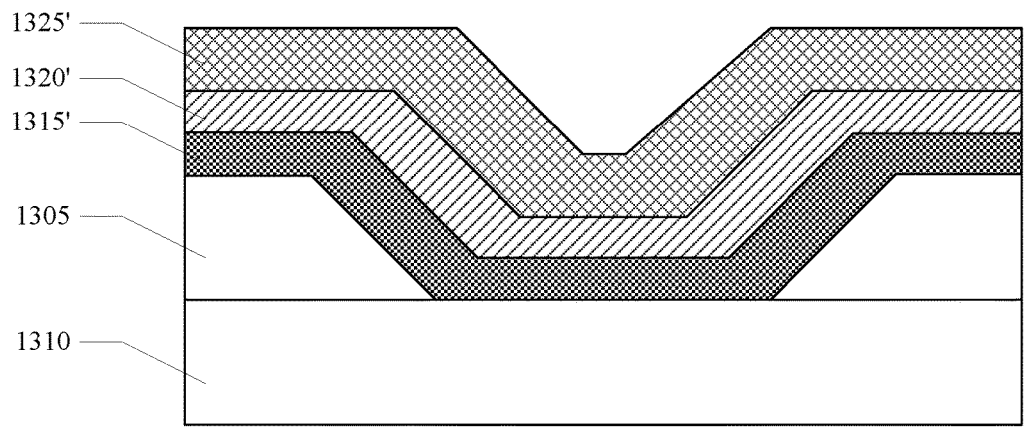
FIGS. 13A-13D illustrate method of fabricating a Magnetic Tunnel Junction (MTJ) device, in accordance with aspects of the present technology.
Figure 13B:
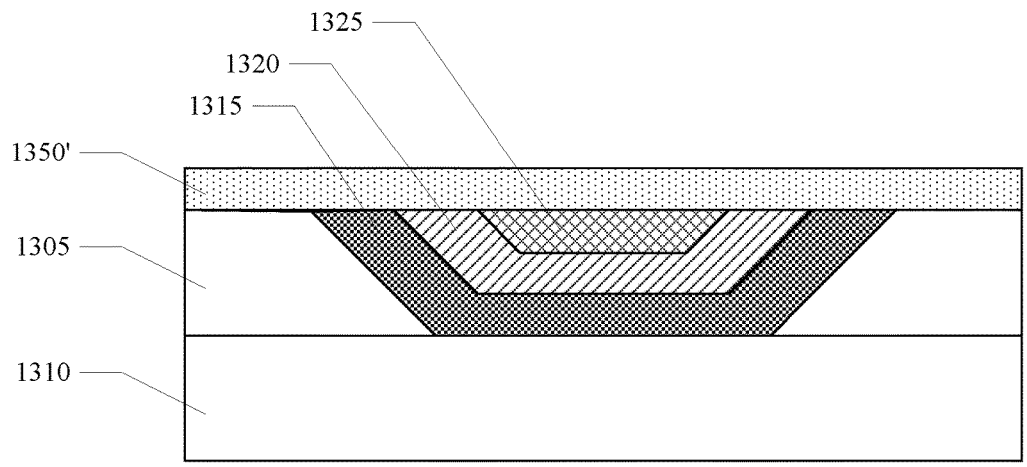
Figure 13C:
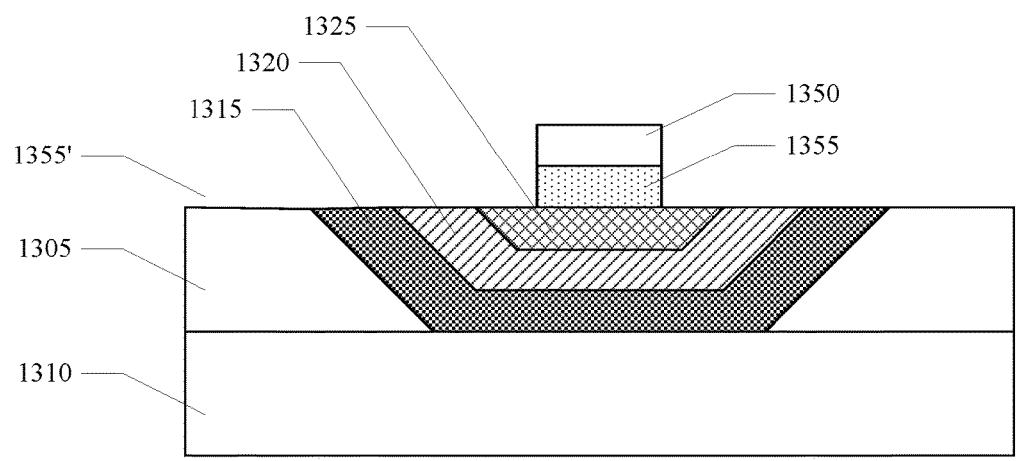
Figure 13D:
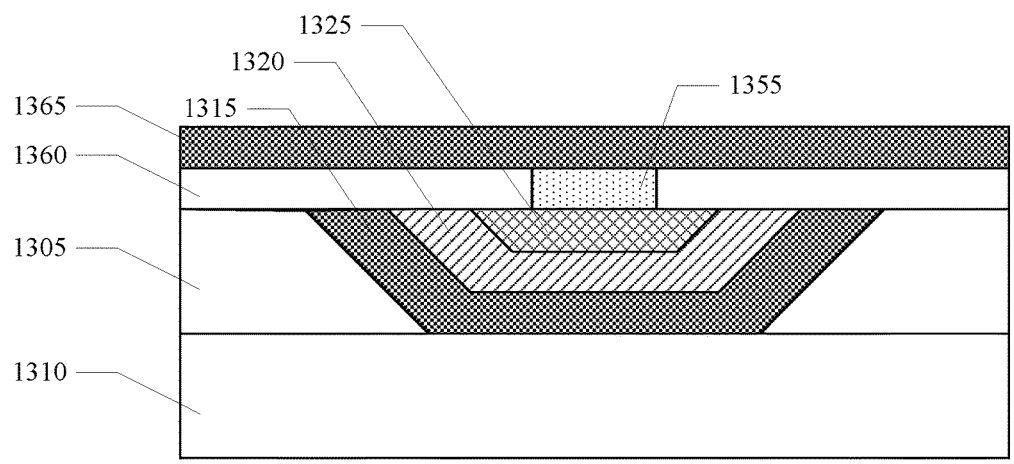

Referring now to FIGS. 12A-12B, a method of fabricating a Magnetic Tunnel Junction (MTJ) device, in accordance with aspects of the present technology, is shown. The method of fabrication will be described with reference to FIGS. 13A-13D, which illustrate the method of fabrication. The MTJ device can be a Magnetoresistive Random Access Memory (MRAM), Spin Torque Magnetoresistive Random Access Memory (ST-MRAM) or similar memory device. In some aspect, a first dielectric layer 1305 can be formed on a wafer 1310, at 1205. In one implementation, forming the first dielectric layer can include depositing a layer of Silicon Oxide (SiO), Silicon Nitride (SiN) or other similar material, with a thickness of approximately 40-60 nm, by a process such as Chemical Vapor Deposition (CVD), Atomic Layer Deposition (ALD), Physical Vapor Deposition (PVD) or Plasma Enhanced Chemical Vapor Deposition or the like.

In some aspects, a plurality of trenches can be formed in columns in the first dielectric layer, at 1210. In one implementation, the plurality of trenches can be formed by selectively etching the first dielectric layer exposed by a trench mask.

In some aspects, a source line layer 1315' can be formed on the first dielectric layer including in the plurality of trenches, at 1215. In one implementation, forming the first source line layer can include depositing a layer of Copper (Cu), Tungsten (W) or other similar material, with a thickness of approximately 100-150 nm, by a process such as Atomic Layer Deposition (ALD).

In some aspects, a selector layer 1320' can be formed on the source line layer including in the plurality of trenches, at 1220. In one implementation, the selector layer can be formed by depositing a layer of Nickel Oxide (NiOx), Titanium Oxide (TiOx), or Vanadium Oxide (VOx) or other similar material, with a thickness of approximately 50 nm, by a process such as sputtering or the like. Sputtering of the selector material can be performed in the presence of a strong electromagnetic fields to confine charge plasma particles close to the surface of the target. Depending on a design current density and rectifying ratio, the thickness of the selector material can composition of the selector material can be tuned and modified. Post-deposition morphology may not be smooth due to the via structure of the selector.

In some aspect, a buffer layer 1325' can be formed on the selector layer including in the plurality of trenches, at 1225. In one implementation, the buffer layer can be formed by depositing a layer of Tantalum Nitride (TaN) or other similar material, with a thickness of approximately 50 nm, by a process such as High-Density Plasma (HDP) deposition or the like. The array of buffers disposed between the array of selectors and the subsequently formed array of MTJs advantageously allow the fabrication of the MTJs without the processes used for forming the selectors affecting the performance parameters of the MTJs.

In some aspects, the select layer, the source line layer and the buffer layer can be planarized to remove the selector layer the source line layer and the buffer layer on the first dielectric layer and leaving selector layer material, source line layer material and buffer layer material in the plurality of trenches, at 1230. In one implementation, the select layer, the source line layer and the buffer layer can be CMPed to remove the selector layer, the source line layer and buffer layer on the first dielectric layer and leaving selector layer material, source line layer material and buffer material in the plurality of trenches. After CMPing the portions of the buffer layers 1325, the selectors 1320, the source lines 1315 and the first dielectric layer can be coplanar.

In some aspects, a first barrier layer can be formed on the coplanar exposed portions of the select layer, source line layer, buffer layer and first dielectric layer, at 1235. In one implementation, the buffer layer can be formed by deposit a layer of Titanium Nitride (TiN), Tantalum Nitride (TaN), Titanium Tungsten (TiW) or other similar material, with a thickness of approximately 5-15 nm, by a process such as Atomic Layer Deposition (ALD) or the like.

In some aspects, a reference magnetic layer can be formed over the first barrier layer, 1240. In one implementation, the reference magnetic layer can be formed by depositing a layer of Cobalt-Iron-Boron (Co—Fe—B) alloy or other similar material, with a thickness of approximately 1-5 nm, by a process such as Physical Vapor Deposition (PVD) or the like.

In some aspects, a non-magnetic tunneling barrier layer can be formed over the reference magnetic layer, at 1245. In one implementation, the non-magnetic tunneling barrier layer can be formed by depositing a layer of Cobalt-Iron-Boron (Co—Fe—B) alloy or other similar material, with a thickness of approximately 0.1-1 nm, by a process such as Physical Vapor Deposition (PVD) or the like.

In some aspects, a free magnetic layer can be formed over the non-magnetic tunneling barrier layer, at 1250. In one implementation, the free magnetic layer can be formed by depositing a layer of Cobalt-Iron-Boron (Co—Fe—B) alloy or other similar material, with a thickness of approximately 0.5-2 nm, by a process such as Physical Vapor Deposition (PVD) or the like.

In some aspects, an array of pillars 1350 can be formed from the free magnetic layer, the non-magnetic tunnel barrier layer, and the reference magnetic layer, at 1255. In one implementation, the array of pillars can be formed by selectively etching the free magnetic layer, the non-magnetic tunnel barrier layer, and the reference magnetic layer exposed by one or more pillar masks 1355.

Fabrication can continue with forming a second dielectric layer 1365 and forming a plurality of bit lines 1370 disposed in rows and coupled to the MTJ pillars 1355. The fabrication of the MTJ device can include numerous other processes that are not germane to an understanding of aspect of the present technology. Therefore, the other processes of fabricating the MTJ device are not described herein.

In some aspects, multiple cell arrays can be fabricated in stacks on top of each other to implement vertical three-dimension (3D) memory architectures, such as cross-point MRAM, cross-point ST-MRAM and the like. The stacked arrays can be formed by repeating the above described processes to form multiple cell arrays stacked upon each other.

Figure 14:
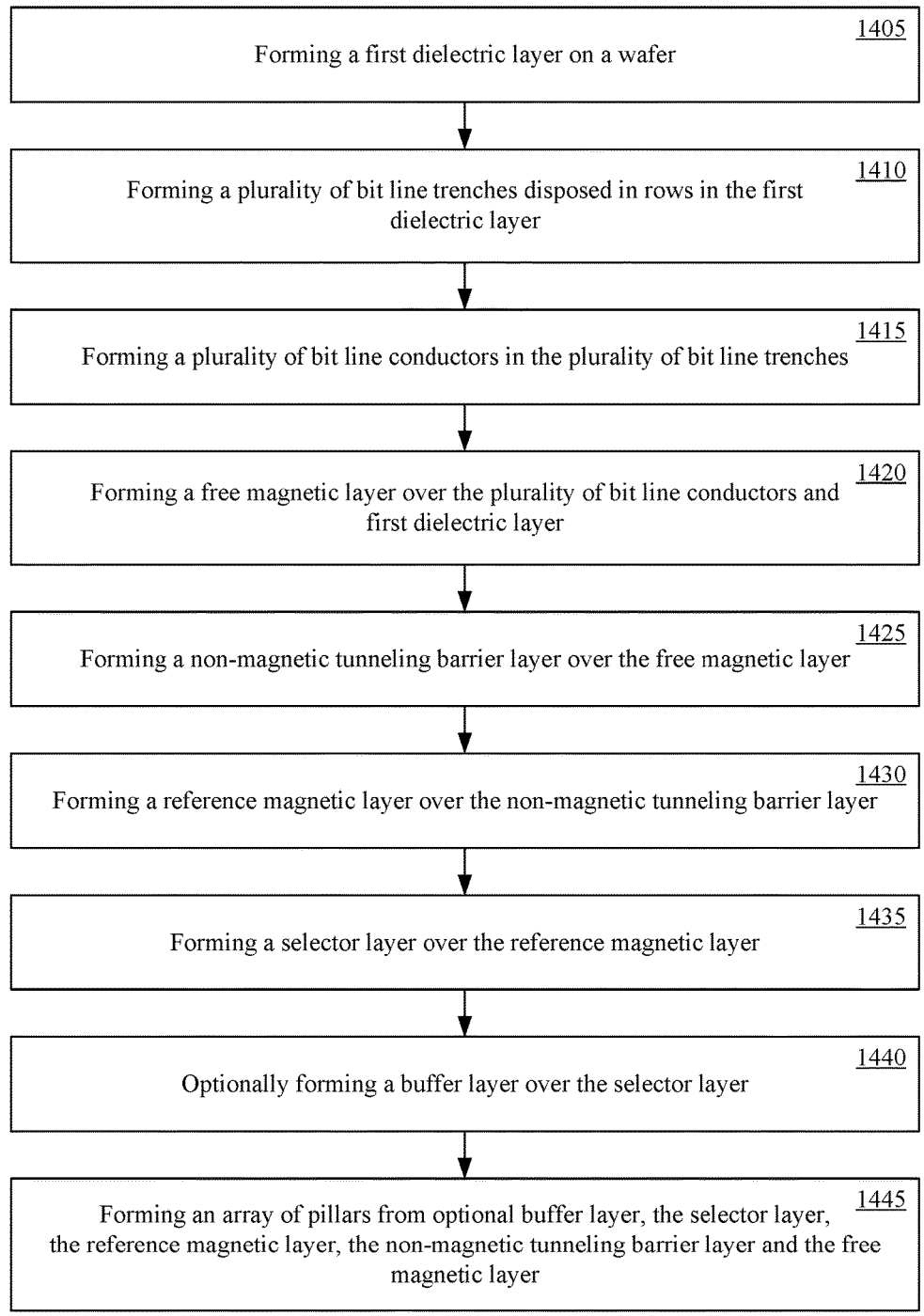
FIG. 14 shows a method of fabricating a Magnetic Tunnel Junction (MTJ) device, in accordance with aspects of the present technology.
Figure 15A:
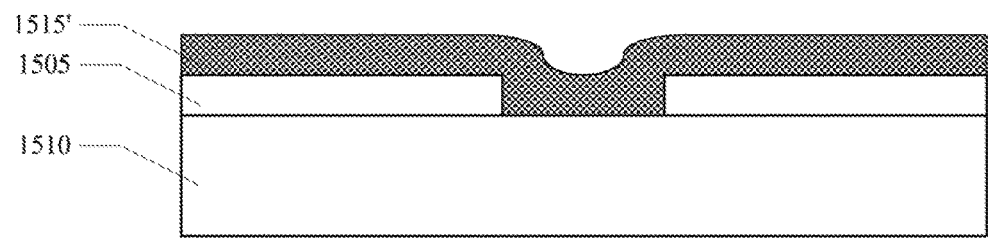
FIGS. 15A-15D illustrate method of fabricating a Magnetic Tunnel Junction (MTJ) device, in accordance with aspects of the present technology.
Figure 15B:
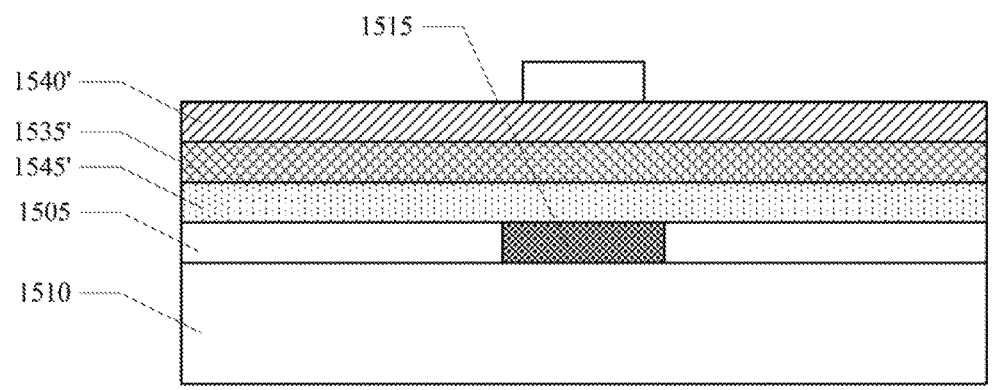
Figure 15C:
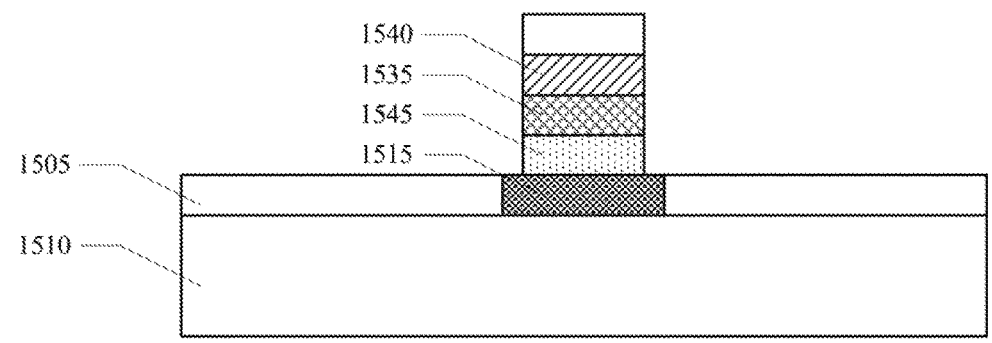
Figure 15D:
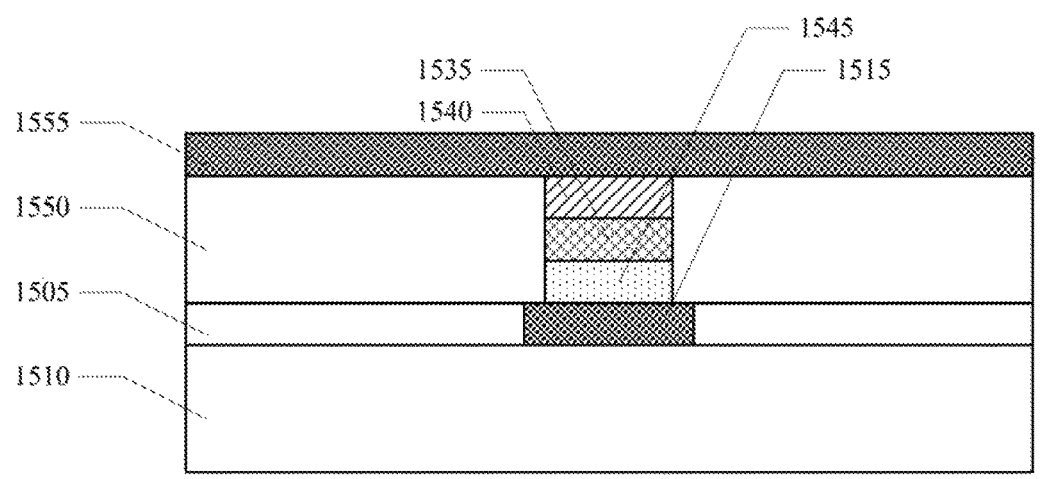

Referring now to FIG. 14, a method of fabricating a Magnetic Tunnel Junction (MTJ) device, in accordance with aspects of the present technology, is shown. The method of fabrication will be described with reference to FIGS. 15A-15D, which illustrate the method of fabrication. The MTJ device can be a Magnetoresistive Random Access Memory (MRAM), Spin Torque Magnetoresistive Random Access Memory (ST-MRAM) or similar memory device. In some aspects, a first dielectric layer 1505 can be formed on a wafer 1510, at 1405. In one implementation, forming the first dielectric layer can include depositing a layer of Silicon Oxide (SiO), Silicon Nitride (SiN) or other similar material, with a thickness of approximately 40-60 nm, by a process such as Chemical Vapor Deposition (CVD), Atomic Layer Deposition (ALD), Physical Vapor Deposition (PVD) or Plasma Enhanced Chemical Vapor Deposition or the like.

In some aspects, a plurality of bit line trenches can be formed in rows in the first dielectric layer, at 1410. In one implementation, the plurality of bit line trenches can be formed by selectively etching the first dielectric layer exposed by a bit line trench mask.

In some aspect, a plurality of bit line conductors 1515 can be formed in the plurality of bit line trenches, at 1415. In one implementation, forming the plurality of bit line conductors can include depositing a first conductive layer 1515' on the first dielectric layer and filling the plurality of bit line trenches. The first conductive layer can be Copper (Cu), Tungsten (W) or other similar conductor deposited by a process such as Atomic Layer Deposition (ALD) or the like. In addition, a first liner layer can be deposited on the first dielectric layer including the plurality of bit line trenches before depositing the first conductive layer. The first line layer can be deposited by a process such as ??? or the like. For conductive material like Copper (Cu) which is characterized by a relatively high solubility and diffusivity in oxide, the first liner layer can be Titanium Nitride (TiN), Tantalum Nitride (TaN), Titanium Nitride/Tantalum Nitride (TiN/TaN) or similar material with a thickness of approximately 5-15 nm, by a process such as High-Density Plasma (HDP) deposition or the like. The first conductive layer can then be Chemical-Mechanical Polished (CMP) to remove the first conductive layer on the first dielectric layer and leaving the first conductive layer material in the plurality of bit line trenches to form the plurality of bit line conductors with a thickness of approximately 100-150 nm. The liner layer on the first dielectric layer can be utilized as a CMP stop. A surface of the bit line conductors can be formed to be coplanar with a surface of the first dielectric layer as a result of the CMP process. In addition, a first capping layer can be deposited on the plurality bit line conductors after the CMP process. The first capping layer can be deposited by a process such as electroplating or the like. The first capping layer can be Titanium Nitride (TiN), Tantalum Nitride (TaN), Titanium Nitride/Tantalum Nitride (TiN/TaN) or similar material with a thickness of approximately 5-15 nm, to reduce solubility and diffusivity of the bit line conductor material into the first dielectric layer and other subsequently formed layers.

In some aspects, a free magnetic layer can be formed over the plurality of bit line conductors and the first dielectric layer, at 1420. In one implementation, the free magnetic layer can be formed by depositing a layer of Cobalt-Iron-Boron (Co—Fe—B) alloy or other similar material, with a thickness of approximately 0.5-2 nm, by a process such as Physical Vapor Deposition (PVD) or the like.

In some aspects, a non-magnetic tunneling barrier layer can be formed over the free magnetic layer, at 1425. In one implementation, the non-magnetic tunneling barrier layer can be formed by depositing a layer of Magnesium Oxide (MgOx) or other similar material, with a thickness of approximately 0.1-1 nm, by a process such as sputtering or the like.

In some aspects, a reference magnetic layer can be formed over the non-magnetic tunneling barrier layer, 1430. In one implementation, the reference magnetic layer can be formed by depositing a layer of Cobalt-Iron-Boron (Co—Fe—B) alloy or other similar material, with a thickness of approximately 1-5 nm, by a process such as Physical Vapor Deposition (PVD) or the like.

In some aspects, a selector layer 1535' can be formed over the reference magnetic layer, at 1435. In one implementation, the selector layer can be formed by depositing a layer of Nickel Oxide (NiOx), Titanium Oxide (TiOx), or Vanadium Oxide (VOx) or other similar material, with a thickness of approximately 40-60 nm, by a process such as sputtering or the like.

In some aspect, an optional buffer layer 1540' can be formed over the selector laery, at 1440. In one implementation, forming the array of buffers can include depositing a buffer layer on the third dielectric layer and filling the array of buffer openings. The buffer layer can be Tantalum Nitride (TaN) or other similar material deposited by a process such as High-Density Plasma (HDP) deposition or the like.

In some aspects, an array of pillars can be formed from the optional buffer layer, the selector layer, the free magnetic layer, the non-magnetic tunnel barrier layer, and the reference magnetic layer, at 1445. In one implementation, the array of pillars can be formed by selectively etching the selector layer, the free magnetic layer, the non-magnetic tunnel barrier layer, and the reference magnetic layer exposed by one or more pillar masks.

Fabrication can continue with forming a second dielectric layer 1550, a plurality of source line trenches, and a plurality of source line conductors 1555 in the plurality of source line trenches. The fabrication of the MTJ device can include numerous other processes that are not germane to an understanding of aspect of the present technology. Therefore, the other processes of fabricating the MTJ device are not described herein.

In some aspects, multiple cell arrays can be fabricated in stacks on top of each other to implement vertical three-dimension (3D) memory architectures, such as cross-point MRAM, cross-point ST-MRAM and the like. The stacked arrays can be formed by repeating the above described processes to form multiple cell arrays stacked upon each other.

Figure 16:
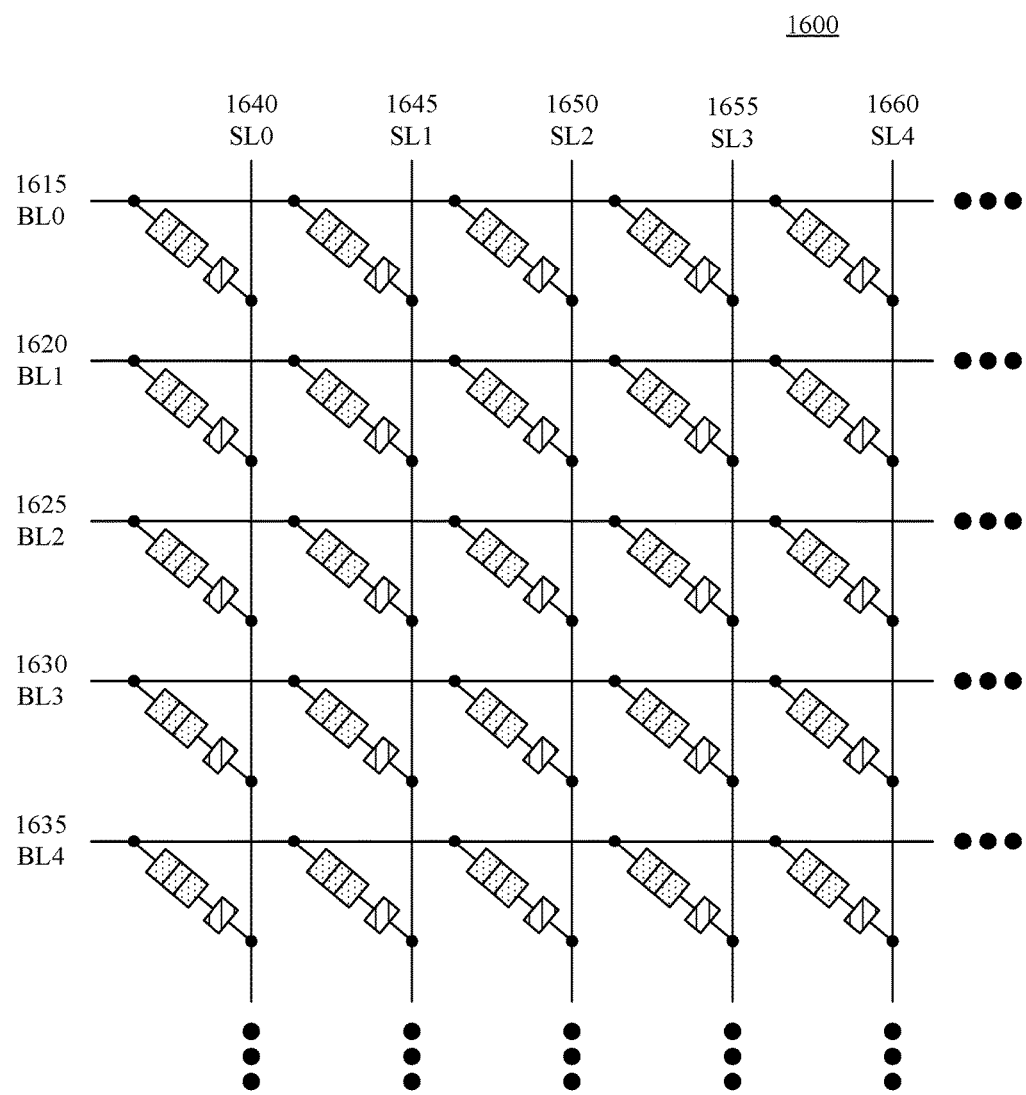
FIG. 16 shows a block diagram of a cell array of a Magnetic Tunnel Junction (MTJ) device, in accordance with aspects of the present technology.

Referring to FIG. 16, a block diagram of a cell array of a Magnetic Tunnel Junction (MTJ) device, in accordance with aspects of the present technology, is shown. The MTJ device can be a Magnetoresistive Random Access Memory (MRAM), Spin Torque Magnetoresistive Random Access Memory (ST-MRAM) or similar memory device. In some aspects, the cell array 1600 can include a plurality of memory cells 1605, 1610, organized in rows and columns, with a plurality of bit lines 1615-1635 arranged along rows, and a plurality of source lines 1640-1660 arranged along columns of the cell array. The memory cells 1605, 1610 can include an MTJ 1605 and a selector 1610 coupled in series between a respective bit line 1620 and a respective source line 1645. The state of the MTJ 1605 can be written to or read by applying appropriate voltage or currents to a corresponding bit line 1620 and a corresponding source line 1645.

In some aspects, the cell array of the MTJ device 1600 can advantageously be stacked on top of each other to implement vertical three-dimension (3D) memory architectures, such as cross-point (e.g., cross-gridded) MRAM, cross-point ST-MRAM and the like.

Figure 17:
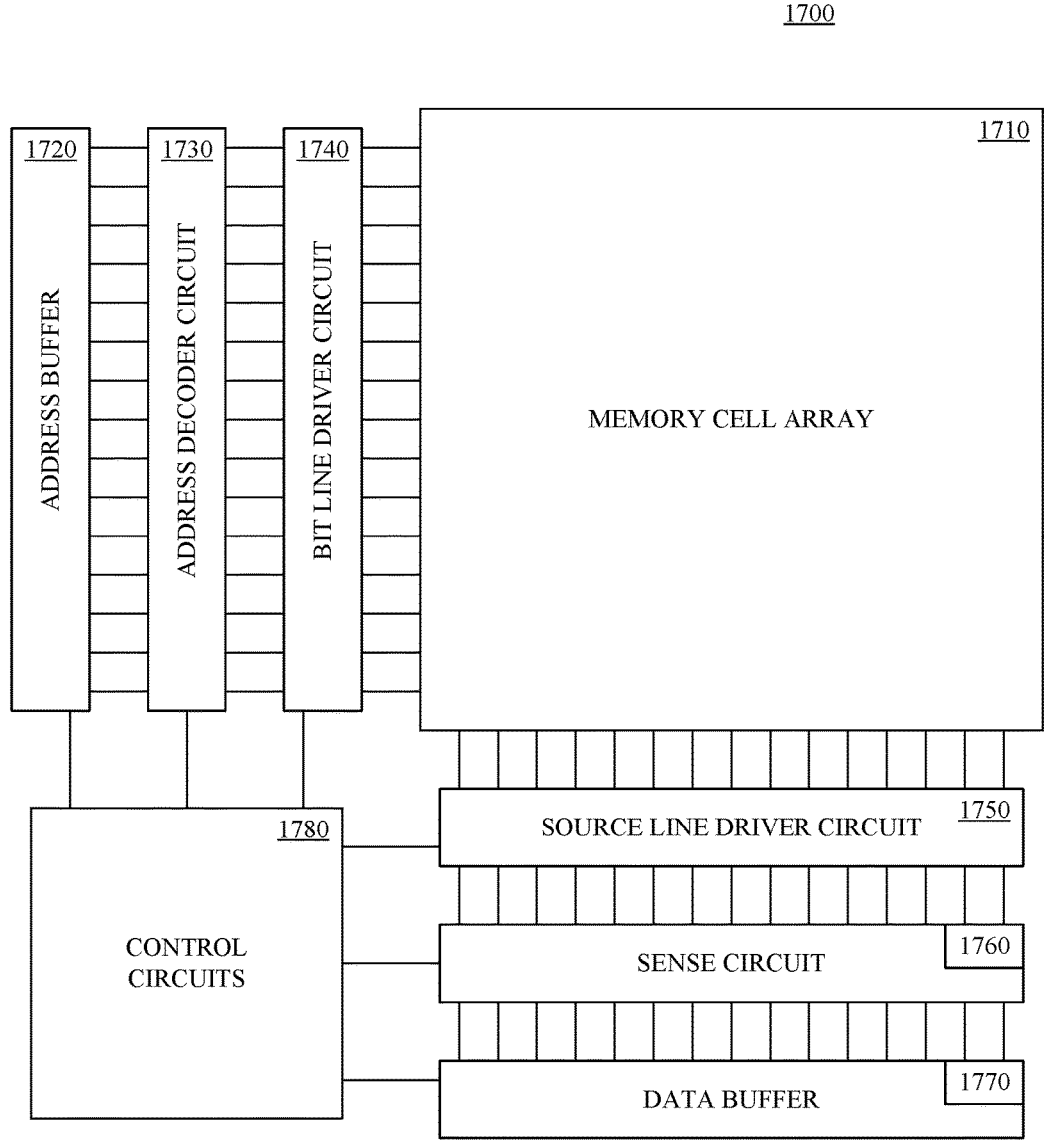
FIG. 17 shows a block diagram of a memory device, in accordance with aspects of the present technology.

Referring to FIG. 17. a block diagram of a memory device, in accordance with aspects of the present technology, is shown. The memory device 1700 can be a Magnetoresistive Random Access Memory (MRAM), Spin Torque Magnetoresistive Random Access Memory (ST-MRAM), 3D cross-point MRAM, 3D cross-point ST-MRAM, or similar memory device. In some aspects, the memory device 1700 can include a memory cell array 1710, an address buffer 1720, an address decoder circuit 1730, a bit line driver circuit 1740, a source line driver circuit 1750, a sense circuit 1760, a data buffer 1770, and control circuit 1780. The memory device 1700 can also include other well-known circuits that are not necessary for an understanding of the present technology and therefore are not discussed herein.

In some aspects, the memory cell array 1710 can include a plurality of memory cells organized in rows and columns, with bit lines and source lines spanning the array of cells. The address buffer 1720 can be configured to receive and buffer a plurality of address signals. The address decoder 1730 can decode the address signals buffered by the address buffer 1720 and output a plurality of decoded address signals. The address decoder 1730 can map a given memory address to a particular row of memory cells in the array. The output of the address decoder 1730 can be input to the bit line driver 1740 and the source line driver 1750. The output of the bit line driver 1740 can drive the bit lines to select a given bit line of the array 1710.

In some aspect, the source line driver 1750 and the sense circuit 1760 utilize the source lines of the array 1710 to read from and write to memory cells of a selected source line of the array 1710. The data read from and written to the memory cells can be buffered in the data buffer 1770. The control circuit 1780 can generate one or more control signals for the control of one or more of the address buffer 1720, the address decoder circuit 1730, the bit line driver circuit 1740, the source line driver circuit 1750, the sense circuit 1760, the data buffer 1770.

Figure 18:
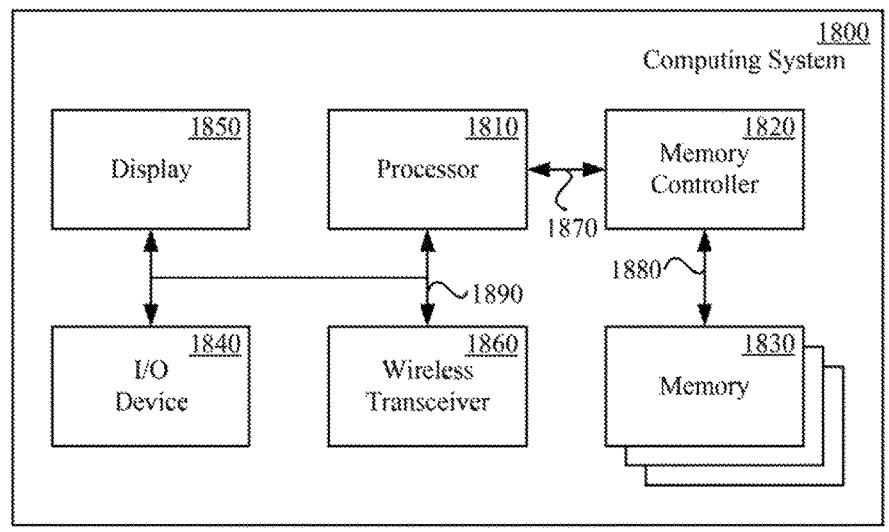
FIG. 18 shows a block diagram of a computing system including a memory device, in accordance with aspects of the present technology.

Referring now to FIG. 18, a block diagram of a computing system including a memory device, in accordance with aspects of the present technology, is shown. The computing system 1800 can, for example, be a cellular telephone, smart phone, e-reader, table personal computer (PC), laptop PC, desktop PC, gaming console, workstation, server computer, or other similar computing device. The computing system 1800 can include one or more processors 1810, one or more memory controllers 5180, one or more memory devices 1830, and one or more input/output devices 1840. The one or more input/output device 1840 can include, for example, a display 1850, a wireless transceiver 1860 and the like. The computing system 1800 can also include other sub-circuits that are not necessary for an understanding of the present technology and therefore are not discussed herein.

The one or more memory controllers 1820 can be operable to control access to data stored in the one or more memory devices 1830 for use by the one or more processors 510, one or more input/output devices 1840 and/or other sub-systems of the computing system 1800 communicatively coupled together by one or more buses 1870-1890. The one or more memory controllers 1820 can generate commands for reading and writing of data in the one or more memory devices 1830 in response to memory requests received from the one or more processors 1810, one or more input/output devices 1840 and/or other sub-systems. One or more of the memory devices 1830 can include the MTJ cell array as described herein. In one implementation, the one or more memory devices 1830 can be a Magnetoresistive Random Access Memory (MRAM), cross-point MRAM, Spin Torque Magnetoresistive Random Access Memory (ST-MRAM), cross-point ST-MRAM or the like.

Figure 19:
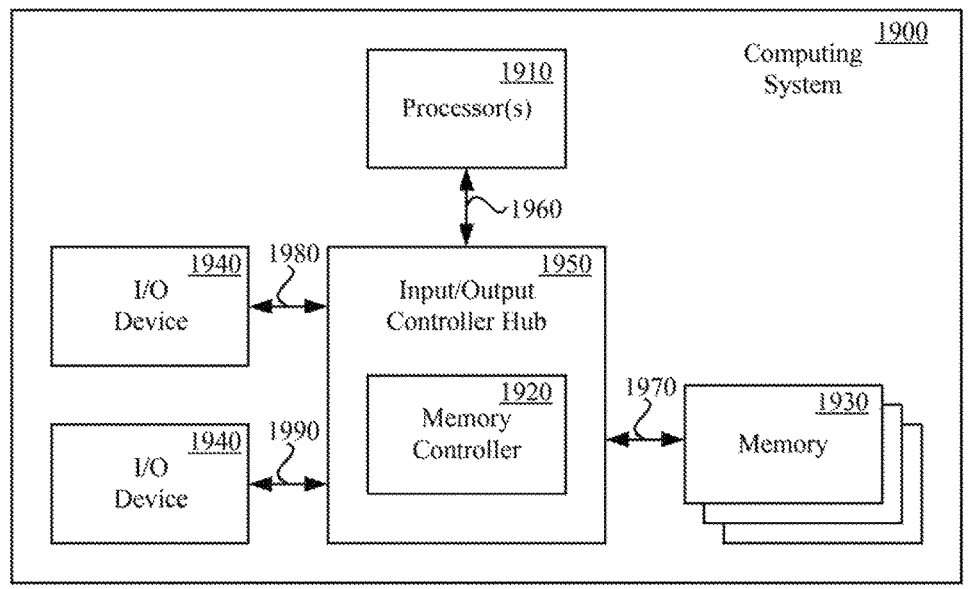
FIG. 19 shows a block diagram of a computing system including a memory device, in accordance with aspects of the present technology.

Referring now to FIG. 19, a block diagram of a computing system including a memory device, in accordance with aspects of the present technology, is shown. The computing system 1900 can, for example, be a cellular telephone, smart phone, e-reader, table personal computer (PC), laptop PC, desktop PC, gaming console, workstation, server computer, or other similar computing device. The computing system 1900 can include one or more processors 1910, one or more memory controllers 1920, one or more memory devices 1930, and one or more input/output devices 1940 that can be communicatively coupled together by one or more input/output controller hubs 1950 through one or more buses 1960-1990. The computing system 1900 can also include other sub-circuits that are not necessary for an understanding of the present technology and therefore are not discussed herein.

The one or more memory controllers 1920 can be integral to one or more other sub-circuits such as the one or more input/output controller hubs 1950 and/or memory devices 1930, or can be implemented as a separate sub-circuit. The one or more memory controllers 1920 can be operable to control access to data stored in the one or more memory devices 1930 for use by the one or more processors 1910, one or more input/output devices 1940 and/or other sub-systems of the computing system 1900. The one or more memory controllers 1920 can generate commands for reading and writing of data in the one or more memory devices 1930 in response to memory requests received from the one or more processors 1910, one or more input/output devices 1940 and/or other sub-systems. One or more of the memory devices 1930 can include the MTJ cell array as described herein. In one implementation, the one or more memory devices 1930 can be a Magnetoresistive Random Access Memory (MRAM), cross-point MRAM, Spin Torque Magnetoresistive Random Access Memory (ST-MRAM), cross-point ST-MRAM, or the like.

Figure 20:
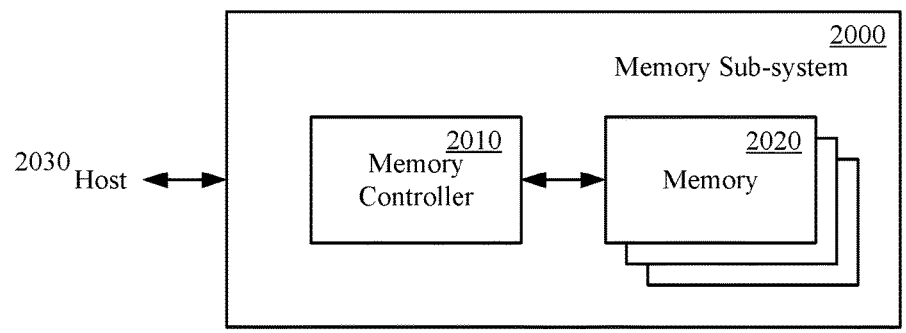
FIG. 20 shows a block diagram of a memory sub-system, in accordance with aspects of the present technology.

Referring now to FIG. 20, a block diagram of a memory sub-system, in accordance with aspects of the present technology, is shown. The memory sub-system 2000 can include one or more memory controllers 2010 and one or more memory devices 2020. The memory sub-system 2000 can be a memory expansion card, Solid State Drive (SSD), or the like that is configurable to be coupled to a host device 2030 such as a cellular telephone, smart phone, e-reader, table personal computer (PC), laptop PC, desktop PC, gaming console, workstation, server computer, or other similar computing device. The memory sub-system 2000 can be coupled to the host device 2030 as in internal or external peripheral device.

Figure 21:
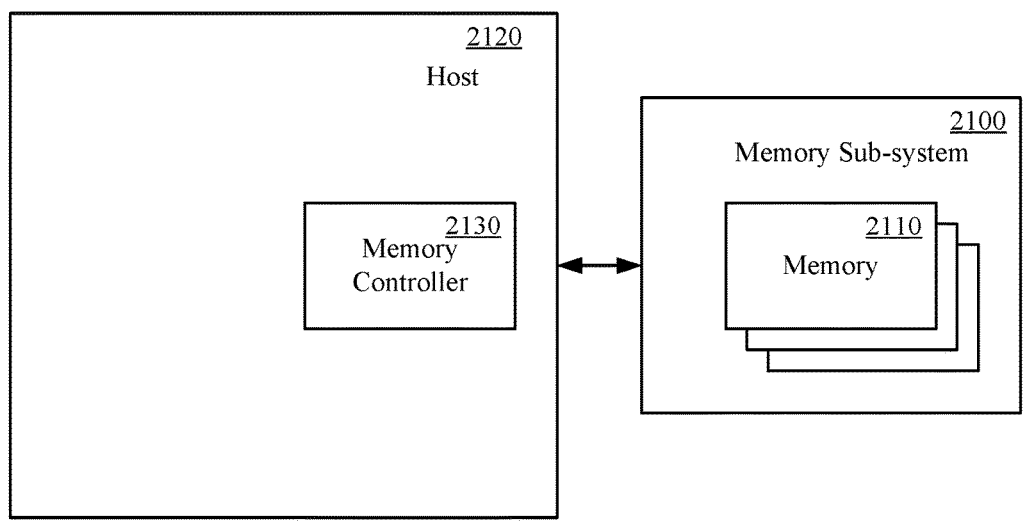
FIG. 21 shows a block diagram of a memory sub-system, in accordance with aspects of the present technology.

The one or more memory controllers 2010 can be operable to control access to data stored in the one or more memory devices 2020 for use by the host device 2030. The one or more memory controllers 2010 can generate commands for reading and writing of data in the one or more memory devices 2020 in response to memory requests received from the host device 2030. One or more of the memory devices 2020 can include the MTJ cell array as described herein. In one implementation, the one or more memory devices 2020 can be a Magnetoresistive Random Access Memory (MRAM), cross-point MRAM, Spin Torque Magnetoresistive Random Access Memory (ST-MRAM), cross-point ST-MRAM, or the like Referring now to FIG. 21, a block diagram of a memory sub-system, in accordance with aspects of the present technology, is shown. The memory sub-system 2100 can include one or more memory devices 2110. The memory sub-system 2100 can be a memory expansion card, Solid State Drive (SSD), or the like that is configurable to be coupled to a host device 2120 such as a cellular telephone, smart phone, e-reader, table personal computer (PC), laptop PC, desktop PC, gaming console, workstation, server computer, or other similar computing device. The host device 2120 can include one or more memory controllers 2130. The memory sub-system 2100 can be coupled to the host device 2120 as in internal or external peripheral device.

The one or more memory controllers 2130 can be operable to control access to data stored in the one or more memory devices 2110 for use by the host device 2120. The one or more memory controllers 2130 can generate commands for reading and writing of data in the one or more memory devices 2110 in response to memory requests received from the host device 2120. One or more of the memory devices 2110 can include the MTJ cell array as described herein. In one implementation, the one or more memory device 2110 can be a Magnetoresistive Random Access Memory (MRAM), cross-point MRAM, Spin Torque Magnetoresistive Random Access Memory (ST-MRAM), cross-point ST-MRAM or the like.

The computing systems and memory sub-systems of FIG. 18-21 are illustrative of exemplary embodiments, and are not intended to limit aspects of the present technology. The cell array of MTJ devices as described herein can be readily applied to any number of conventional memory devices, memory sub-systems, and/or computing systems, along with memory devices, memory sub-systems, and/or computing systems to be developed in the future.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method of fabricating a Magnetic Tunnel Junction (MTJ) device comprising:
   forming a plurality of source line conductors in a plurality of source line trenches, wherein a surface of the source line conductors are coplanar with a surface of a first dielectric layer;
   forming a second dielectric layer on the first dielectric layer and the source line conductors;
   forming an array of selector openings in the second dielectric layer, wherein sets of selector openings extended to respective source line conductors;

forming an array of selectors in the array of selector openings, wherein a surface of the selectors are coplanar with a surface of the second dielectric layer; and forming an array of MTJ pillars coupled to the array of selectors.

2. The method of claim 1, further comprising:

forming a third dielectric layer on the second dielectric layer and the array of selectors;

forming an array of buffer openings in the third dielectric layer, wherein the buffer openings extend to respective selectors;

forming an array of buffers in the array of buffer openings; and wherein the array of MTJ pillars are coupled to the array of selectors through the array of buffers.

3. The method of claim 2, wherein:

forming the array of buffer openings in the third dielectric layer includes selectively etching the third dielectric layer exposed by a buffer mask to form the array of buffer openings; and forming the array of buffers in the third dielectric layer includes, depositing a buffer layer on the third dielectric layer and filling the array of buffer openings; and chemically-mechanically polishing the buffer layer to remove the buffer layer on the third dielectric layer and leaving the buffer layer in the array of buffer opening to form the array of buffers.

4. The method of claim 1, further comprising:

forming the plurality of source line trenches disposed in columns in the first dielectric layer.

5. The method of claim 4, wherein:

forming the plurality of source line trenches in the first dielectric layer includes selectively etch the first dielectric layer exposed by a source line trench mask to form the plurality of source line trenches; and forming the plurality of source line conductors includes, depositing a first conductive layer on the first dielectric layer and filling the plurality of source line trenches; and chemical-mechanical polishing the first conductive layer to remove the first conductive layer on the first dielectric layer and leaving the first conductive layer in the plurality of source line trenches to form the plurality of source line conductors.

6. The method of claim 5, wherein forming the plurality of source line conductors further includes depositing a first liner layer on the first dielectric layer including the plurality of source line trenches before depositing the first conductive layer.

7. The method of claim 5, wherein forming the plurality of source line conductors further includes depositing a first capping layer on the plurality of source line conductors after chemical-mechanical polishing of the first conductive layer.

8. The method of claim 1, wherein:

forming the array of selector opening in the second dielectric layer includes selectively etching the second dielectric layer exposed by a selector mask to form the array of selector openings; and forming the array of selectors includes, depositing a selector layer on the second dielectric layer and filling the array of selector openings; and chemically-mechanically polishing the selector layer to remove the selector layer on the second dielectric layer and leaving the selector layer in the array of selector openings to form the array of selectors.

9. A method of forming a Magnetic Tunnel Junction (MTJ) device comprising:

forming a plurality of source line trenches disposed in columns in a first dielectric layer;

forming a plurality of source line conductors in the plurality of source line trenches;

forming a selector layer over the first dielectric layer and the plurality of source line conductors;

forming a first barrier layer on the selector layer;

forming a reference magnetic layer over the first barrier layer;

forming a non-magnetic tunneling barrier layer over the reference magnetic layer;

forming a free magnetic layer over the non-magnetic tunneling barrier layer;

forming a first portion of an array of pillars from the free magnetic layer, the non-magnetic tunneling barrier layer and reference magnetic layer;

forming a conformal dielectric layer on the exposed portions of the free magnetic layer, the non-magnetic tunnel barrier layer, and the reference magnetic layer in the first portion of the pillars and the exposed portions of the first barrier layer; and forming a second portion of the array of pillars from the first barrier layer and the select layer, wherein portions of the conformal dielectric layer along sidewalls of the first portion of the array of pillars protect one or more of the free magnetic layer, the non-magnetic tunneling barrier layer and the reference magnetic layer during forming the second portion of the array of pillars.

10. The method of claim 9, further comprising:

forming a buffer layer over the selector layer; and forming the second portion of the array of pillars from the first barrier layer, the buffer layer and the select layer, wherein portions of the conformal dielectric layer along sidewalls of the first portion of the array of pillars protect one or more of the free magnetic layer, the non-magnetic tunneling barrier layer and the reference magnetic layer during forming the second portion of the array of pillars.

11. The method of claim 9, wherein:

forming the plurality of source line trenches in the first dielectric layer includes selectively etch the first dielectric layer exposed by a source line trench mask to form the plurality of source line trenches; and forming the plurality of source line conductors includes, depositing a first conductive layer on the first dielectric layer and filling the plurality of source line trenches; and chemical-mechanical polishing the first conductive layer to remove the first conductive layer on the first dielectric layer and leaving the first conductive layer in the plurality of source line trenches to form the plurality of source line conductors.

12. A method of forming a Magnetic Tunnel Junction (MTJ) device comprising:

forming a source line layer on a first dielectric layer including in a plurality of trenches disposed in columns in the first dielectric layer;

forming a selector layer over the source line layer including in the plurality of trenches;

planarizing the selector layer and the source line layer to remove the selector layer and the source line layer on the first dielectric layer and leaving the source line layer and selector layer in the plurality of trenches;

forming a reference magnetic layer over the first barrier layer;

forming a non-magnetic tunneling barrier layer over the reference magnetic layer;

forming a free magnetic layer over the non-magnetic tunneling barrier layer;

forming a first portion of an array of pillars from the free magnetic layer, the non-magnetic tunneling barrier layer and reference magnetic layer;

forming a conformal dielectric layer on the exposed portions of the free magnetic layer, the non-magnetic tunnel barrier layer, and reference magnetic layer in the first portion of the pillars and the exposed portions of the first barrier layer; and forming a second portion of the array of pillars from the first barrier layer and select layer, wherein portions of the conformal dielectric layer along sidewall of the first portion of the array of pillars protect one or more the free magnetic layer, the non-magnetic tunneling barrier layer and the reference magnetic layer during forming the second portion of the array of pillars.

13. The method of claim 12, further comprising: forming a first barrier layer on coplanar exposed portions of the selector layer, source line layer and first dielectric layer before forming the reference layer.

14. The method of claim 12, further comprising:

forming a buffer layer on coplanar exposed portions of the selector layer, source line layer and first dielectric layer before forming the reference layer; and forming the second portion of the array of pillars from the buffer layer, wherein portions of the conformal dielectric layer along sidewalls of the first portion of the array of pillars protect one or more of the free magnetic layer, the non-magnetic tunneling barrier layer and the reference magnetic layer during forming the second portion of the array of pillars.

15. A method of forming a Magnetic Tunnel Junction (MTJ) device comprising:

forming a source line layer on a first dielectric layer including in a plurality of trenches;

forming a selector layer on the source line layer including in the plurality of trenches;

forming a buffer layer on the selector layer including in the plurality of trenches;

planarizing the buffer layer, the selector layer and the source line layer to remove buffer layer, the selector layer and the source line layer on the first dielectric layer and leaving buffer layer, the source line layer and selector layer in the plurality of trenches;

forming a first barrier layer on the coplanar exposed portions of the buffer layer, the selector layer, source line layer and first dielectric layer;

forming a reference magnetic layer over the first barrier layer;

forming a non-magnetic tunneling barrier layer over the reference magnetic layer;

forming a free magnetic layer over the non-magnetic tunneling barrier layer; and forming an array of pillars from the free magnetic layer, the non-magnetic tunneling barrier layer and reference magnetic layer.

16. A method of forming a Magnetic Tunnel Junction (MTJ) device comprising:

forming a plurality of bit line conductors in a plurality of bit line trenches, wherein a surface of the bit line conductors are coplanar with a surface of a first dielectric layer;

forming a free magnetic layer over the plurality of bit line conductors and first dielectric layer;

forming a non-magnetic tunneling barrier layer over the free magnetic layer;

forming a reference magnetic layer over the non-magnetic tunneling barrier layer;

forming a selector layer over the reference magnetic layer; and forming an array of pillars from the selector layer, the reference magnetic layer, the non-magnetic tunneling barrier layer and the free magnetic layer.

17. The method of claim 16, further comprising:

forming a buffer layer over the reference magnetic layer before forming the selector layer; and forming the array of pillars from the selector layer, the buffer layer, the reference magnetic layer, the non-magnetic tunneling barrier layer and the free magnetic layer.

18. The method of claim 16, further comprising:
forming the first dielectric layer on a wafer; and
forming the plurality of bit line trenches disposed in rows in the first dielectric layer.

19. The method of claim 18, wherein:

forming the plurality of bit line trenches in the first dielectric layer includes selectively etch the first dielectric layer exposed by a bit line trench mask to form the plurality of bit line trenches; and forming the plurality of bit line conductors includes,
depositing a first conductive layer on the first dielectric layer and filling the plurality of bit line trenches; and
chemical-mechanical polishing the first conductive layer to remove the first conductive layer on the first dielectric layer and leaving the first conductive layer in the plurality of bit line trenches to form the plurality of bit line conductors.

20. The method of claim 19, wherein forming the plurality of bit line conductors further includes depositing a first liner layer on the first dielectric layer including the plurality of bit line trenches before depositing the first conductive layer.

21. The method of claim 19, wherein forming the plurality of bit line conductors further includes depositing a first capping layer on the plurality of bit line conductors after chemical-mechanical polishing of the first conductive layer.

* * * * *